United States Patent
Sato et al.

(10) Patent No.: US 6,171,715 B1
(45) Date of Patent: Jan. 9, 2001

(54) ORGANIC ELECTROLUMINESCENT ELEMENT

(75) Inventors: Tadahisa Sato, Kanagawa; Shintaro Hara, Osaka; Akira Gyoutoku, Osaka; Hideaki Iwanaga, Osaka; Takahiro Komatsu, Osaka, all of (JP)

(73) Assignees: Fuji Photo Film Co., Ltd., Kanagawa; Matsushita Electric Industrial Co., Ltd., Osaka, both of (JP)

( * ) Notice: Under 35 U.S.C. 154(b), the term of this patent shall be extended for 0 days.

(21) Appl. No.: 09/124,682

(22) Filed: Jul. 30, 1998

(30) Foreign Application Priority Data

Aug. 7, 1997 (JP) .................................................. 9-212777
Mar. 31, 1998 (JP) .................................................. 10-087015

(51) Int. Cl.$^7$ .................................................. H05B 33/14
(52) U.S. Cl. .......................... 428/690; 428/704; 428/917; 313/504; 313/506
(58) Field of Search ..................................... 428/690, 691, 428/917, 704; 8/648; 548/156, 219, 305.4; 544/137; 313/504, 506

(56) References Cited

U.S. PATENT DOCUMENTS 3,657,231 * 4/1972 Booth .................................. 544/193.2
3,926,969    12/1975 Fleck et al. .
4,119,634 * 10/1978 Schroeder ............................ 260/307

(List continued on next page.)

FOREIGN PATENT DOCUMENTS 7-157473 * 6/1995 (JP) .

OTHER PUBLICATIONS

A. Reiser, "Fluorescence of Aromatic Benzoxazole Derivatives", J. Amer. Chem. Soc. 1972, 94(7), 2414–21, (no month).
Yoshida et al, Chemical Abstract 81:38885, Nov. 8, 1973.*
Kamiyama et al, Chemical Abstract 113:14864, Nov. 1989.*

* cited by examiner

Primary Examiner—Marie Yamnitzky
(74) Attorney, Agent, or Firm—Sughrue, Mion, Zinn, Macpeak & Seas, PLLC

(57) ABSTRACT

An organic thin-film electroluminescent (organic EL) element having an improved luminescent efficiency and improved stability is described, which comprises a substrate and, formed thereover, an anode for injecting holes, a cathode for injecting electrons, and at least one organic-compound layer interposed between the anode and the cathode, wherein the organic-compound layer comprises, for example, any of the following organic compounds.

11 Claims, 1 Drawing Sheet

U.S. PATENT DOCUMENTS

| | | | |
|---|---|---|---|
| 4,539,507 | * 9/1985 | VanSlyke et al. | 313/504 |
| 5,281,489 | * 1/1994 | Mori et al. | 428/690 |
| 5,766,779 | * 6/1998 | Shi et al. | 428/690 |
| 5,856,434 | * 1/1999 | Stern et al. | 528/402 |
| 5,986,121 | * 11/1999 | Uchida et al. | 556/404 |
| 5,998,626 | * 12/1999 | Sato | 548/219 |

ORGANIC ELECTROLUMINESCENT ELEMENT

FIELD OF THE INVENTION

The present invention relates to an organic electroluminescent element for use, e.g., as various displays or as a light source or back light for displays or a luminescent element for optical communication apparatuses.

BACKGROUND OF THE INVENTION

An electroluminescent element is a luminescent device which takes advantage of the electroluminescence of a solid fluorescent substance. Inorganic electroluminescent elements employing an inorganic luminescent material have been put to practical use, and some of these are used as the back lights of liquid-crystal displays and in applications such as flat displays. However, inorganic electroluminescent elements have drawbacks that the voltage required for the elements to luminesce is as high as 100 V or higher, and that full-color displaying based on the three primary colors of red, green, and blue is difficult to attain because of difficulties in obtaining blue luminescence.

On the other hand, electroluminescent elements comprising organic materials have received attention from long ago. Although various investigations were made thereon, none of these was directed to full-scale practical use of organic electroluminescent elements because of the exceedingly low luminescent efficiencies thereof. However, in 1987, C. W. Tang et al. with Eastman Kodak Co. proposed an organic electroluminescent element having a laminated structure comprising two organic-material layers having functions respectively allotted thereto, i.e., a hole-transporting layer and a luminescent layer, and showed that this organic electroluminescent element attains a luminance as high as 1,000 cd/m$^2$ or higher even at a voltage as low as 10 V or below [see, for example, U.S. Pat. No. 4,539,507 and C. W. Tang and S. A. Vanslyke, *Appl. Phys. Lett.*, 51, 913 (1987)]. Organic electroluminescent elements suddenly came to attract attention thereafter, and investigations are currently being made enthusiastically on organic electroluminescent elements having a similar laminated structure in which functions are allotted to the individual layers.

A conventional organic electroluminescent element is explained below with reference to FIG. 1, which is a view illustrating the constitution of the conventional organic electroluminescent element. In FIG. 1, numeral 1 denotes a substrate, 2 an anode, 3 a hole-transporting layer, 4 a luminescent layer, and 5 a cathode. As shown in FIG. 1, this conventional organic electroluminescent element comprises: a transparent or translucent substrate 1 made of, e.g., glass; an anode 2 which is a film of a transparent electroconductive material, e.g., indium tin oxide (hereinafter abbreviated as "ITO"), formed on the substrate 1 by sputtering, vapor deposition with resistance heating, etc.; a hole-transporting layer 3 made of, e.g., N,N'-diphenyl-N,N'-bis(3-methylphenyl)- 1,1'-diphenyl-4,4'-diamine (hereinafter abbreviated as "TPD") formed on the anode 2 by vapor deposition with resistance heating, etc.; a luminescent layer 4 made of, e.g., 8-hydroxyquinoline aluminum (hereinafter abbreviated as "Alq") formed on the hole-transporting layer 3 by vapor deposition with resistance heating, etc.; and a cathode 5 which is a metal film having a thickness of from 100 to 300 nm formed on the luminescent layer 4 by vapor deposition with resistance heating, etc.

When a DC voltage or a direct current is applied to an organic electroluminescent element having the constitution described above, with the anode 2 and the cathode 5 as a positive electrode and a negative electrode, respectively, then holes are injected from the anode 2 through the hole-transporting layer 3 into the luminescent layer 4 and electrons are injected from the cathode 5 into the luminescent layer 4. In the luminescent layer 4, the holes recombine with the electrons and the resultant excitons shift from the excited state to the ground state, during which luminescence occurs. In the case where the luminescent layer in the above constitution contains Alq, green luminescence is obtained. It is theoretically possible to obtain luminescence of any desired color by employing an organic compound having a modified molecular structure. Consequently, organic electroluminescent elements can cope with full-color displaying and are promising future display elements having the advantage of low driving voltage. Although the above constitution has organic-compound layers of a laminated structure, i.e., a hole-transporting layer for transporting holes and a luminescent layer, other constitutions can be selected according to constituent materials. For example, use may be made of a constitution consisting of a luminescent layer alone, a three-layer structure composed of a hole-transporting layer, a luminescent layer, and an electron-transporting layer, or a constitution containing a layer which is a mixture of a luminescent layer with a hole-transporting layer or of a luminescent layer with an electron-transporting layer.

There also is a technique in which a luminescent layer partly doped with an organic compound dopant having a high fluorescent quantum yield is used and luminescence is taken out from the dopant (host-guest system). In this case, the material serving as the host is required to permit excitons resulting from its own luminescence to move smoothly in order to enable smooth exciton movement to the dopant. It is therefore necessary to select a host material satisfying requirements, for example, that the luminescent spectrum of the host material overlaps sufficiently with the excitation wavelengths of the dopant, and that the dopant is more susceptible to oxidation and reduction than the host material. There also is an element constitution in which energy barrier is taken in account in order to obtain luminescence not through exciton energy transfer from a guest. In this case, a host material which has the property of efficiently injecting or transporting holes or electrons to the dopant is selected. It is therefore possible to take out luminescence from a hole-transporting or electron-transporting layer having no luminescent region by incorporating a dopant thereinto. The dopant luminescence enables multiple colors ranging from blue to red, and a high-efficiency element can be provided by taking out the intense luminescence of dopants. In general, many materials for use as dopants have such a concentration quenching that these materials in a solid state show no clear fluorescence but in a dilute solution show intense luminescence. Such dopant materials are preferably used in a concentration not higher than several percents by mole. Consequently, materials used as thinner films have an advantage that there is a wider choice of materials because such materials are less required to have film-forming properties.

As described above, an organic electroluminescent element having a luminescent layer comprising an organic luminescent material can be made to have luminescence of any desired color by changing the molecular structure of the organic luminescent material. Furthermore, various high-efficiency luminescent elements based on the host-guest system have been proposed. However, such prior art elements are deficient in the satisfactory luminance properties and durability on a level suitable for practical use.

SUMMARY OF THE INVENTION

In view of the problems described above, an object of the present invention is to provide an organic electroluminescent element having a high luminescent efficiency and high stability.

The present inventors made intensive investigations in order to eliminate the problems described above. As a result, they have found that the above object is accomplished by using a certain kind of organic compound. The present invention has been achieved based on this finding.

The present invention provides:

(1) An organic electroluminescent element comprising a substrate and, formed thereover, an anode for injecting holes, a cathode for injecting electrons, and at least one organic-compound layer interposed between the anode and the cathode, said organic-compound layer comprising at least one of organic compounds represented by the following formula (I), (II), or (III):

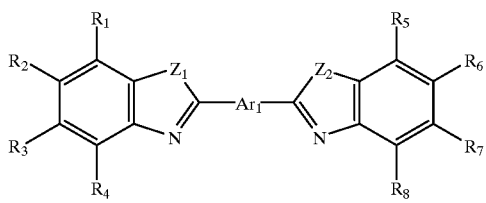

(I)

wherein $R_1$ to $R_8$ each represents a hydrogen atom or an optionally substitutable atom or group, provided that at least one of $R_1$ to $R_8$ represents an alkoxy group, an aryloxy group, a dialkylamino group, an N-alkyl-N-arylamino group, or a diarylamino group; $Ar_1$ represents a bivalent group derived from benzene, anthracene, or an aromatic heterocyclic ring or from an aromatic hydrocarbon ring assembly, provided that the bivalent group derived from benzene, or anthracene is an m- or o-phenylene group, or a 1,5-, 2,6-, or 1,8-anthracenediyl group, respectively; and $Z_1$ and $Z_2$ each represents an oxygen atom, a sulfur atom, or a monosubstituted nitrogen atom,

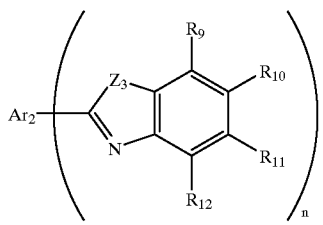

(II)

wherein $R_9$ to $R_{12}$ each represents a hydrogen atom or an optionally substitutable atom or group, provided that at least one of $R_9$ to $R_{12}$ represents an alkoxy group, an aryloxy group, a dialkylamino group, an N-alkyl-N-arylamino group, or a diarylamino group; $Ar_2$ represents a group derived from benzene, naphthalene, anthracene, or an aromatic heterocyclic ring other than triazine or from an aromatic ring assembly; $Z_3$ represents an oxygen atom, a sulfur atom, or a mono-substituted nitrogen atom; and n represents an integer of 3 or 4,

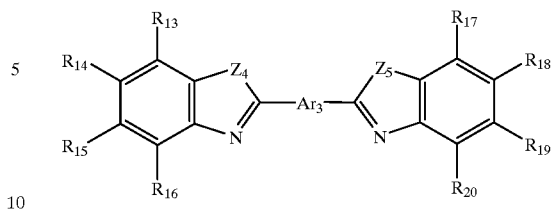

(III)

wherein $R_{13}$ to $R_{20}$ each represents a hydrogen atom or an optionally substitutable atom or group; $Ar_3$ represents a bivalent group derived from an aromatic ring assembly containing at least one aromatic heterocyclic ring; and $Z_4$ and $Z_5$ each represents an oxygen atom, a sulfur atom, or a monosubstituted nitrogen atom;

(2) The organic electroluminescent element described in (1) above, wherein the organic-compound layer has a luminescent layer having a luminescent region and the luminescent layer comprises at least one of the organic compounds represented by formula (I), (II), or (III);

(3) The organic electroluminescent element described in (2) above, wherein the luminescent layer comprises at least two organic compounds, at least one of which is represented by formula (I), (II), or (III);

(4) The organic electroluminescent element described in (1) and (2) above, wherein the organic-compound layer has a laminated structure comprising the luminescent layer and a layer of another kind of organic material having electron-transporting or hole-transporting properties, or is made of a mixture of the luminescent layer with the organic material; and (5) The organic electroluminescent element described in (1) above, wherein the organic-compound layer is made of a dispersion comprising a polymeric compound and the at least one organic compound dispersed therein.

The above constitutions have the function of enabling the organic electroluminescent element to luminesce stably over long at a high luminescent efficiency.

DETAILED DESCRIPTION OF THE INVENTION

Figure 1:
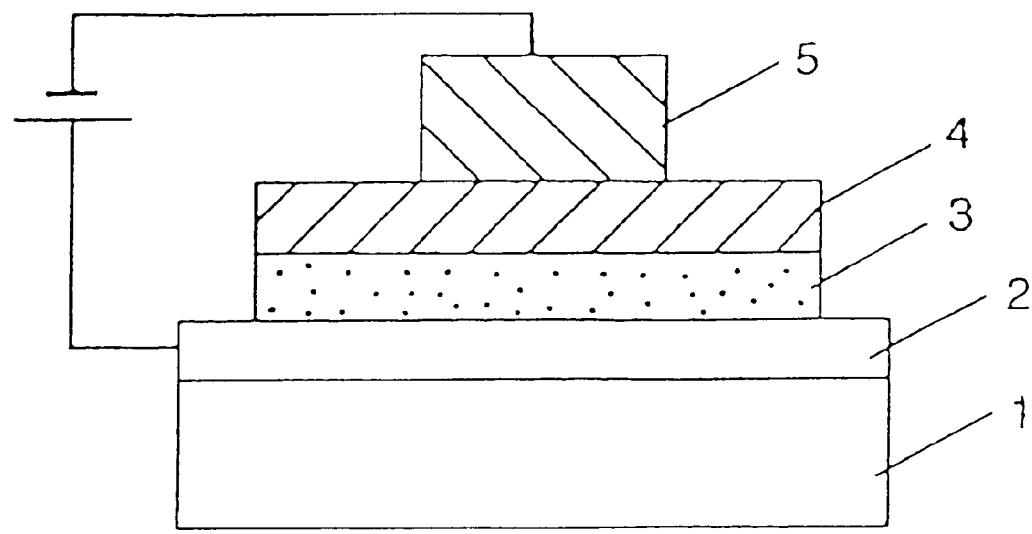
FIG. 1 is a view illustrating the constitution of a conventional organic electroluminescent element.

The compounds represented by formula (I) for use in the present invention are explained below in detail. In formula (I), $R_1$ to $R_8$ each represents a hydrogen atom or an optionally substitutable atom or group. Examples of the optionally substitutable atom or group include halogen atoms, alkyl, aryl, heterocyclic, cyano, hydroxy, nitro, carboxyl, sulfo, amino, alkoxy, aryloxy, acylamino, mono- or dialkylamino, N-unsubstituted or N-alkyl- or N-aryl-substituted arylamino, ureido, sulfamoylamino, alkylthio, arylthio, alkoxycarbonylamino, sulfonamido, carbamoyl, sulfamoyl, sulfonyl, alkoxycarbonyl, heterocyclic oxy, azo, acyloxy, carbamoyloxy, silyloxy, aryloxycarbonylamino, imido, heterocyclic thio, sulfinyl, phosphonyl, aryloxycarbonyl, acyl, silyl, and azolyl groups. Any adjacent two of $R_1$ to $R_8$ may be bonded to each other to form a saturated or unsaturated ring (e.g., an aromatic ring).

Preferred examples of $R_1$ to $R_8$ include a hydrogen atom, halogen atoms, alkyl groups, aryl groups, alkoxy groups, aryloxy groups, dialkylamino groups, N-alkyl-N-arylamino groups, and diarylamino groups. Specific examples thereof include a hydrogen atom, halogen atoms such as fluorine, chlorine, and bromine, substituted or unsubstituted, linear or branched alkyl groups having 1 to 12 carbon atoms, substituted or unsubstituted aryl groups having 6 to 20 carbon atoms, substituted or unsubstituted alkoxy groups having 1 to 6 carbon atoms, substituted or unsubstituted aryloxy groups having 6 to 20 carbon atoms, substituted or unsubstituted dialkylamino groups having 2 to 16 carbon atoms, substituted or unsubstituted N-alkyl-N-arylamino groups having 7 to 21 carbon atoms, and substituted or unsubstituted diarylamino groups having 12 to 36 carbon atoms.

More specific examples of $R_1$ to $R_8$ other than hydrogen and halogen atoms include alkyl groups such as methyl, ethyl, n-propyl, n-octyl, n-dodecyl, 2-methoxyethyl, 2-phenylmethyl, benzyl, isopropyl, isobutyl, s-butyl, t-butyl, t-amyl, t-octyl, cyclopentyl, cyclohexyl, and cycloheptyl; heptyl; aryl groups such as phenyl, 2-, 3-, or 4-methylphenyl, 4-t-butylphenyl, 4-methoxyphenyl, 4-dimethylaminophenyl, 1- or 2-naphthyl, anthryl, and phenanthryl; alkoxy groups such as methoxy, ethoxy, n-propoxy, n-butoxy, n-hexyl, isopropoxy, isobutoxy, t-butoxy, cyclopentyloxy, and cyclohexyloxy; aryloxy groups such as phenoxy, 2-, 3-, or 4-methylphenoxy, 4-t-butylphenoxy, 4-phenylphenoxy, 4-methoxyphenoxy, 2-cyclohexylphenoxy, 3-ethylphenoxy, 1- or 2-naphthoxy, anthryloxy, and phenanthryloxy; dialkylamino groups such as dimethylamino, diethylamino, dibutylamino, dioctylamino, N-methylbutylamino, bis(2-methoxyethyl) amino, and bis(2-chloroethyl)amino; N-alkyl-N-arylamino groups such as N-methylanilino, N-butylanilino, and N-methyl-1-naphthylamino; and diarylamino groups such as diphenylamino, N-(3-methylphenyl)anilino, N-(4-methylphenyl)anilino, bis(4-methylphenyl)amino, N-naphthylanilino, and dinaphthylamino.

Although at least one of $R_1$ to $R_8$ represents an alkoxy, aryloxy, dialkylamino, N-alkyl-N-arylamino, or diarylamino group, it is preferred that at least one of $R_2$, $R_3$, $R_6$, and $R_7$ be any of these groups.

$Ar_1$ represents a bivalent group derived from benzene, anthracene, or an aromatic heterocyclic ring or from an aromatic hydrocarbon ring assembly. However, the bivalent group derived from benzene or anthracene is an m- or o-phenylene group or a 1,5-, 2,6-, or 1,8-anthracenediyl group, respectively. These groups may have one or more substituents. Examples of the aromatic heterocyclic ring include thiophene, furan, oxazole, oxadiazole, triazole, pyridine, pyrazine, pyrimidine, triazine, and carbazole. Examples of the aromatic hydrocarbon ring assembly include ring assemblies each comprising aromatic hydrocarbon ring systems such as benzene, naphthalene, or anthracene. A ring assembly is defined as "a group of two or more ring systems directly bonded to each other through single or double bonds, with the number of bonds being smaller by one than the number of the ring systems" (see Kenzo Hirayama and Kazuo Hirayama, "Yūkikagaku•Seikagaku Meimei-hō (Nomenclature in Organic Chemistry/Biochemistry)", revised 2nd ed., 1st vol., p.39, 1988, Nanko-do K.K.). A preferred example of the aromatic heterocyclic ring is thiophene, and preferred examples of the aromatic hydrocarbon ring assembly are benzene ring assemblies.

The term "a group derived from a compound or ring" as used herein means "a group obtained by removing at least one hydrogen atom from the compound or ring".

Typical examples of unsubstituted $Ar_1$ are given below. However, $Ar_1$ should not be construed as being limited thereto. In the following typical examples, R represents an alkyl group or an aryl group.

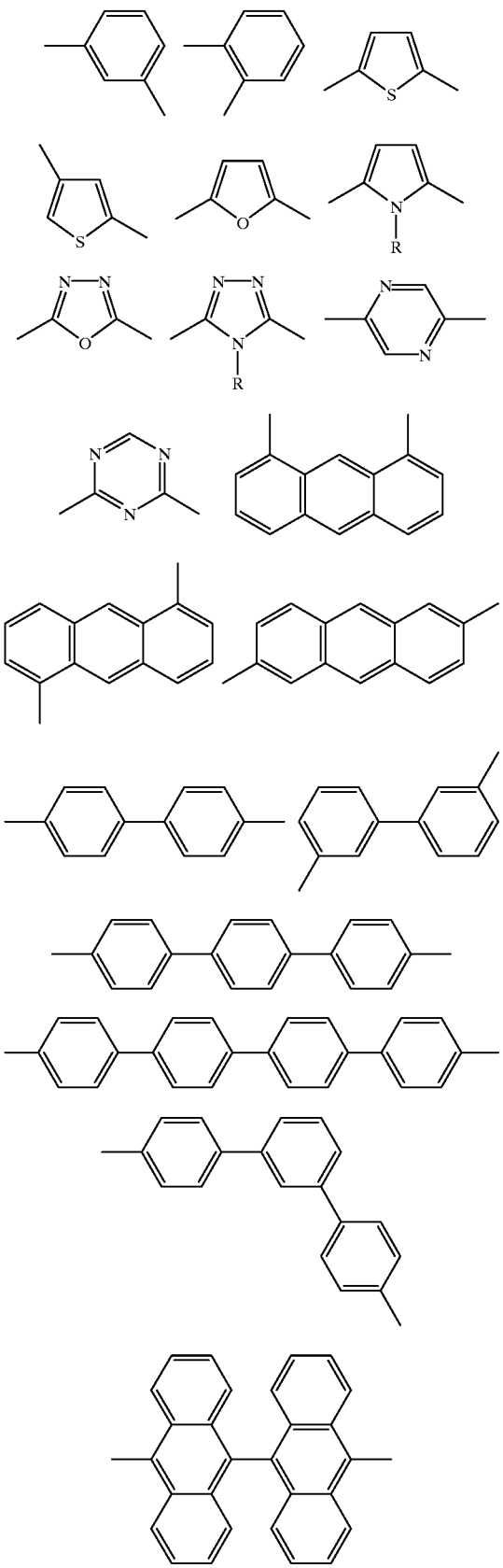

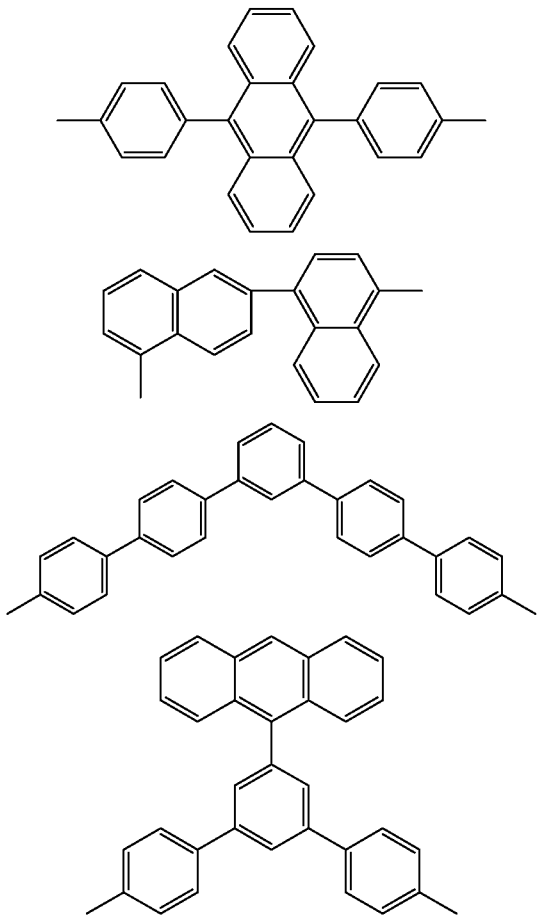

In the case where $Ar_1$ is a substituted group, this $Ar_1$ can have one or more substituents selected from the same optionally substitutable atoms and groups as those enumerated hereinabove as examples of $R_1$ to $R_8$. Preferred examples of the substituents include halogen atoms, alkyl groups, alkoxy groups, aryloxy groups, dialkylamino groups, N-alkyl-N-arylamino groups, and diarylamino groups. Preferred examples of $Ar_1$ include m- or o-phenylene, 1,5-, 2,6-, or 1,8-anthracenediyl, bivalent groups derived from thiophene, and bivalent groups derived from a benzene ring assembly, which each is unsubstituted or has one or more of the preferred substituents enumerated above. More preferred examples of $Ar_1$ include bivalent groups derived from unsubstituted thiophene or from a benzene ring assembly.

$Z_1$ and $Z_2$ each represents an oxygen atom, a sulfur atom, or a monosubstituted nitrogen atom. The monosubstituted nitrogen atom is a nitrogen atom substituted with an alkyl or aryl group. The alkyl and aryl groups have the same meanings as those represented by $R_1$ to $R_8$ described hereinabove. $Z_1$ and $Z_2$ each is preferably an oxygen atom or a sulfur atom, more preferably an oxygen atom.

Preferred examples of the structure of formula (I) are represented by the following formula (IV) or (V):

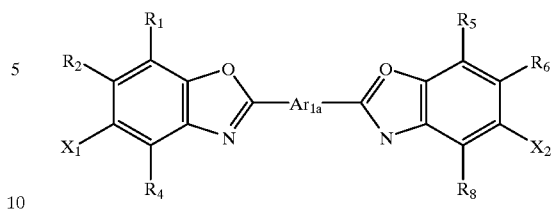

wherein $R_1$, $R_2$, $R_4$, $R_5$, $R_6$, and $R_8$ are the same as defined hereinabove; $X_1$ and $X_2$ each represents an alkoxy, aryloxy, dialkylamino, N-alkyl-N-arylamino, or diarylamino group; and $Ar_{1a}$ is a bivalent group derived from thiophene or from a benzene ring assembly;

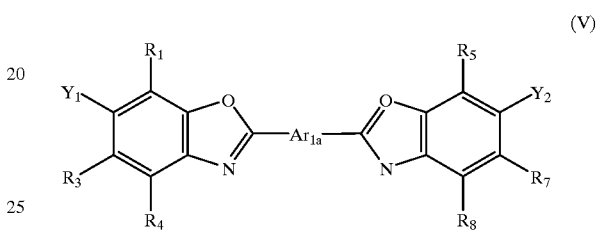

wherein $R_1$, $R_3$, $R_4$, $R_5$, $R_7$, and $R_8$ are the same as defined hereinabove; $Y_1$ and $Y_2$ each represents an alkoxy, aryloxy, dialkylamino, N-alkyl-N-arylamino, or diarylamino group; and $Ar_{1a}$ is the same as defined above.

Details of the alkoxy, aryloxy, dialkylamino, N-alkyl-N-arylamino, or diarylamino group represented by $X_1$, $X_2$, $Y_1$, or $Y_2$ are the same as those of the same groups given hereinabove with regard to $R_1$ to $R_8$. The bivalent group represented by $Ar_{1a}$, which is derived from thiophene or from a benzene ring assembly, has the same meaning as that described above with regard to $Ar_1$.

$X_1$, $X_2$, $Y_1$, and $Y_2$ each preferably is an alkoxy, dialkylamino, or diarylamino group. Aria is preferably a bivalent group derived from a benzene ring assembly.

The compounds represented by formula (II) are explained next in detail. In formula (II), $R_9$ to $R_{12}$ each represents a hydrogen atom or an optionally substitutable atom or group. Details of the optionally substitutable atom or group are the same as those given hereinabove with regard to $R_1$ to $R_8$. Preferred examples thereof are also the same.

Although at least one of $R_9$ to $R_{12}$ represents a cycloalkyl, alkoxy, dialkylamino, N-alkyl-N-arylamino, or diarylamino group, it is preferred that at least one of $R_{10}$ and $R_{11}$ be any of these groups. More preferably, $R_{10}$ is any of these groups.

$Ar_2$ represents a group derived from benzene, naphthalene, anthracene, or an aromatic heterocyclic ring other than triazine or from an aromatic ring assembly. Examples of the aromatic heterocyclic ring include thiophene, furan, pyrrole, oxazole, oxadiazole, triazole, pyridine, pyrazine, pyrimidine, and carbazole. Examples of the aromatic ring assembly include ring assemblies each comprising aromatic ring systems other than triazine (e.g., hydrocarbon rings such as benzene, naphthalene, or anthracene or heterocyclic rings such as thiophene or pyrimidine). A preferred example of the aromatic heterocyclic ring is thiophene, and preferred examples of the aromatic ring assembly are aromatic hydrocarbon ring assemblies and ring assemblies comprising a combination of one or more aromatic hydrocarbon rings and one or more thiophene rings.

Typical examples of unsubstituted $Ar_2$ are given below. However, $Ar_2$ should not be construed as being limited thereto.

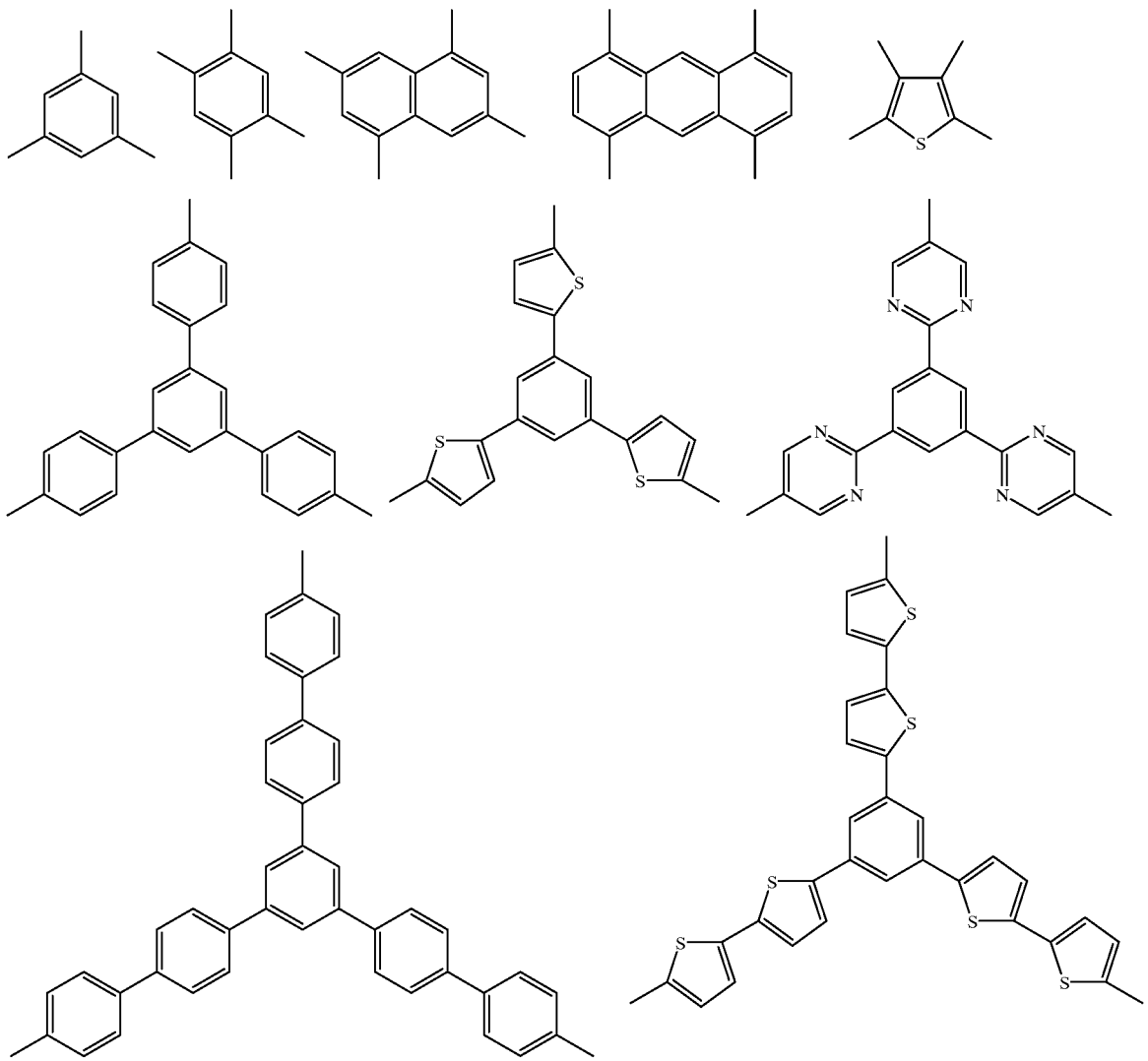

In the case where Ar$_2$ is a substituted group, this Ar$_2$ can have one or more substituents selected from the same optionally substitutable atoms and groups as those enumerated hereinabove as examples of R$_1$ to R$_8$. Preferred examples of the substituents include halogen atoms, alkyl groups, alkoxy groups, aryloxy groups, dialkylamino groups, N-alkyl-N-arylamino groups, and diarylamino groups. Preferred examples of Ar$_2$ include tri- or tetravalent groups derived from benzene, naphthalene, anthracene, or an aromatic heterocyclic ring other than triazine or from an aromatic ring assembly, which groups each is unsubstituted or has one or more of the preferred substituents enumerated above. More preferred examples of Ar$_2$ include trivalent groups derived from unsubstituted benzene or an aromatic hydrocarbon ring assembly or from a ring assembly comprising a combination of one or more aromatic hydrocarbon rings and one or more thiophene rings.

Z$_3$ is an atom, which has the same meaning as Z$_1$ and Z$_2$.

Although n represents an integer of 3 or 4, it preferably represents 3. Although the compounds represented by formula (II) each has three or four benzoxazole or benzothiazole rings in the molecule, these rings may be the same or different.

The compounds represented by formula (III) for use in the present invention are explained next in detail. In formula (III), R$_{13}$ to R$_{20}$ each represents a hydrogen atom or an optionally substitutable atom or group. Details of the optionally substitutable atom or group are the same as those given hereinabove with regard to R$_1$ to R$_8$. Preferred examples thereof are also the same.

Ar$_3$ represents a bivalent group derived from an aromatic ring assembly containing at least one aromatic heterocyclic ring. More specifically, Ar$_3$ represents a bivalent group derived from an aromatic ring assembly which comprises at least one aromatic heterocyclic ring, e.g., thiophene, furan, oxazole, oxadiazole, triazole, pyridine, pyrazine, pyrimidine, triazine, or carbazole, and one or more aromatic rings which are not heterocyclic, e.g., benzene, naphthalene, or anthracene.

In the case where Ar$_3$ has one or more substituents, these substituents are ones selected from the same optionally substitutable atoms and groups as those enumerated hereinabove as examples of R$_1$ to R$_8$. Preferred examples of the substituents include halogen atoms, alkyl groups, alkoxy groups, aryloxy groups, dialkylamino groups, N-alkyl-N-arylamino groups, and diarylamino groups. Preferred examples of Ar$_3$ include bivalent groups derived from an aromatic ring assembly which contains at least one thiophene ring and which is unsubstituted or has one or more of the preferred substituents enumerated above. More preferred examples of $Ar_3$ include bivalent groups derived from an unsubstituted aromatic ring assembly comprising thiophene rings alone or a combination of one or more thiophene rings and one or more benzene rings.

Typical examples of unsubstituted $Ar_3$ are given below. However, $Ar_3$ should not be construed as being limited thereto.

wherein $R_{13}$ to $R_{20}$ are the same as defined hereinabove; $Ar_4$ represents a 2,5-thiophenediyl or p-phenylene group; $Z_6$ and $Z_7$ each represents an atom having the same meaning as $Z_4$ and $Z_5$; and m represents an integer of 0 to 5.

Specific examples of the compounds represented by each of formulae (I) to (VI) for use in the present invention are

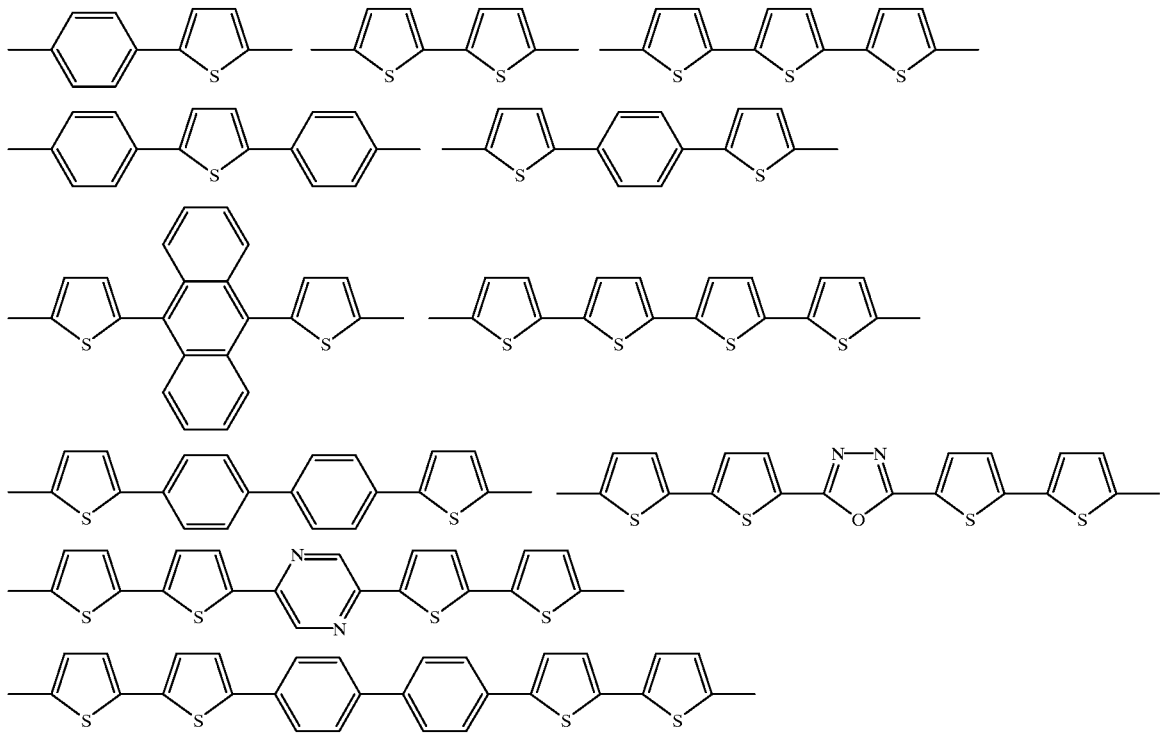

$Z_4$ and $Z_5$ each is an atom, which has the same meaning as $Z_1$ and $Z_2$.

Preferred examples of the structure of formula (III) a resented by the following formula (VI):

shown below. However, the compounds of each of formulae (I) to (VI) should not be construed as being limited to the following examples.

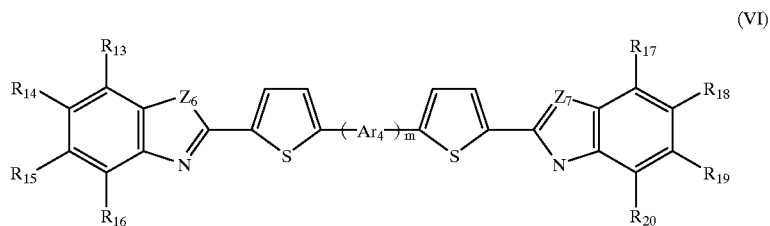

(VI)

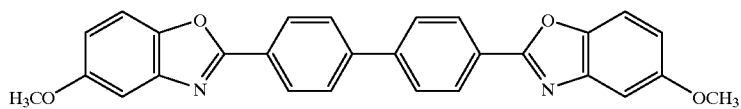
(1)
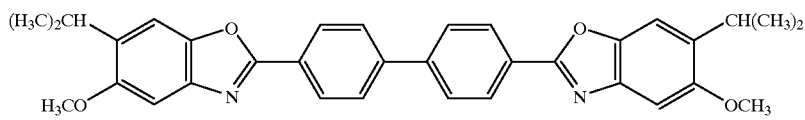
(2)
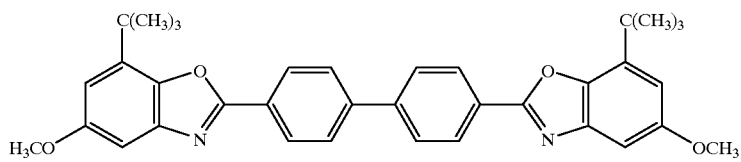
(3)
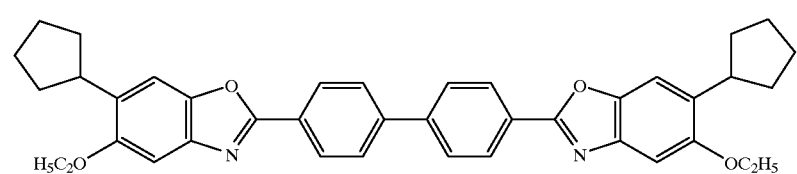
(4)
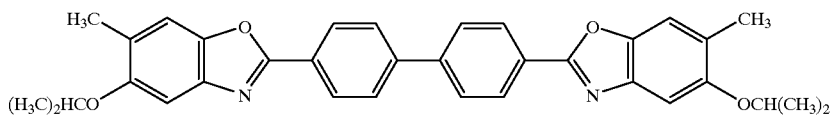
(5)
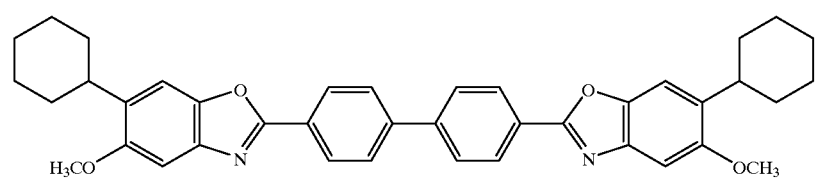
(6)
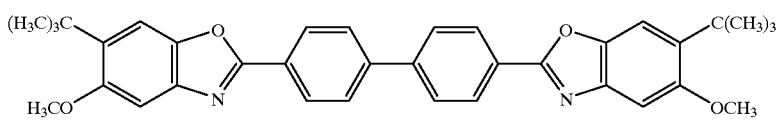
(7)
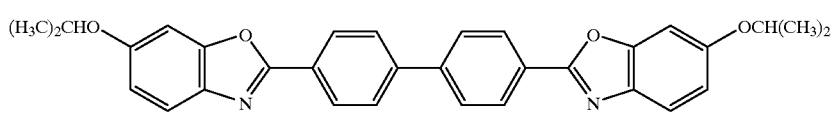
(8)
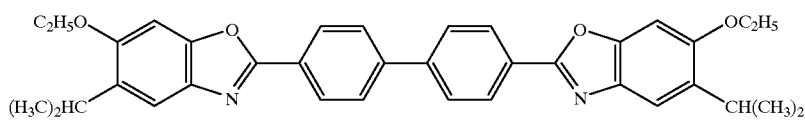
(9)
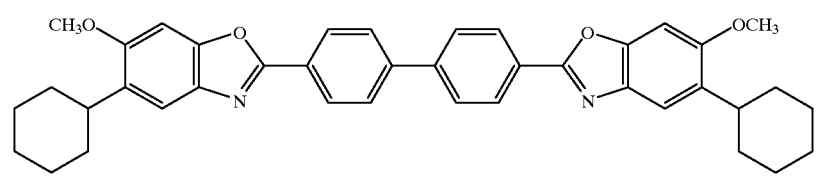
(10)

-continued
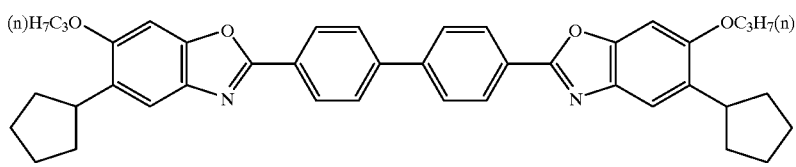
(11)
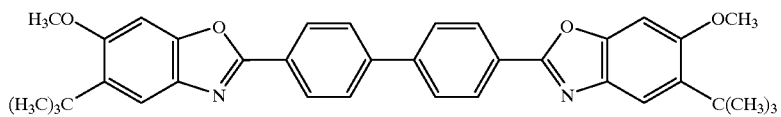
(12)
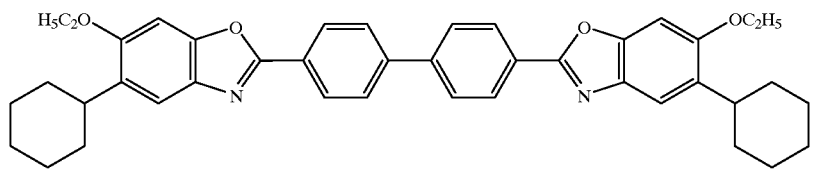
(13)
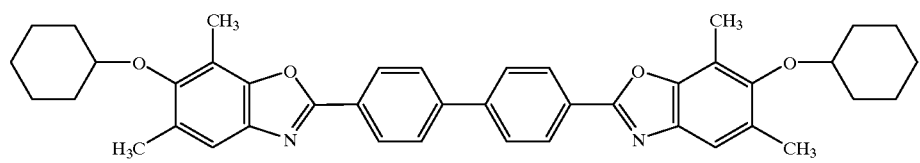
(14)
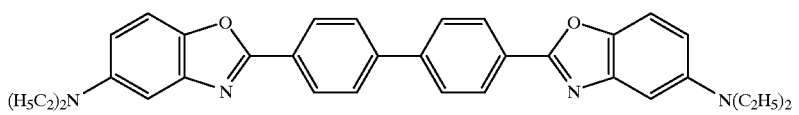
(15)
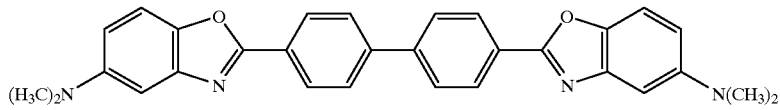
(16)
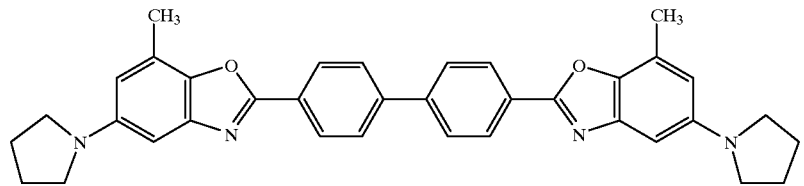
(17)
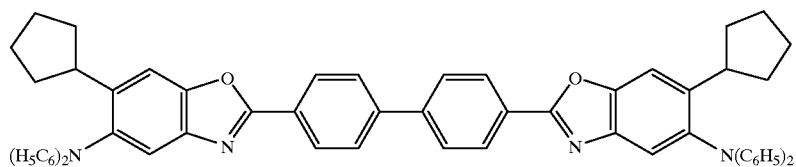
(18)
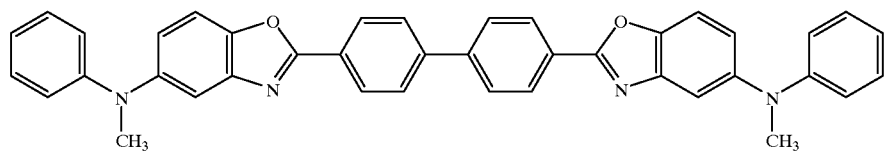
(19)

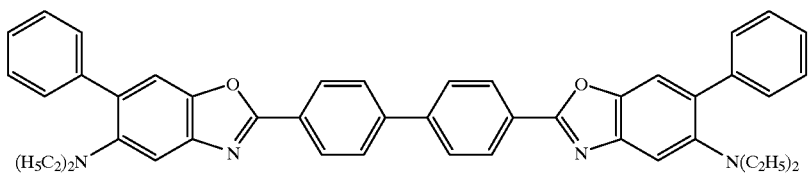
(20)
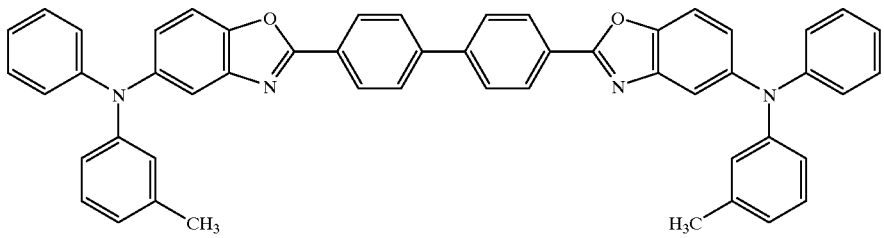
(21)
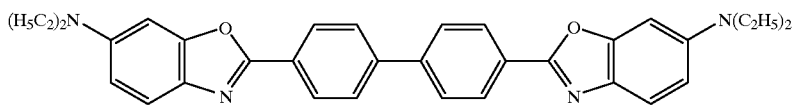
(22)
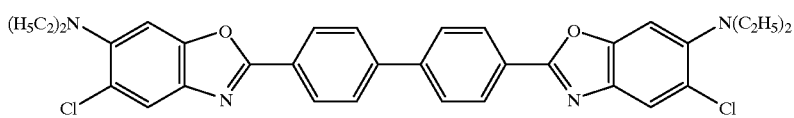
(23)
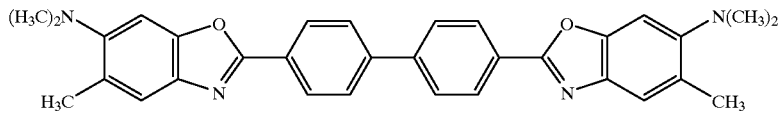
(24)
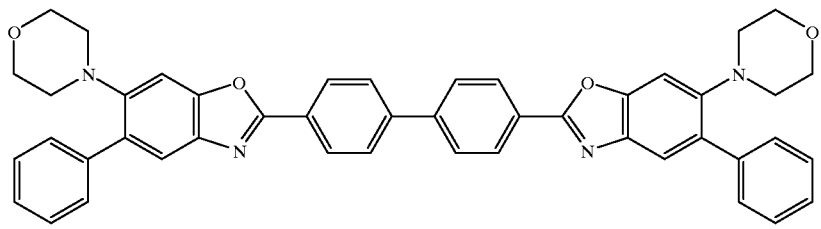
(25)
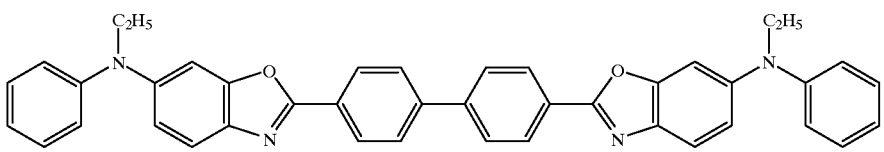
(26)
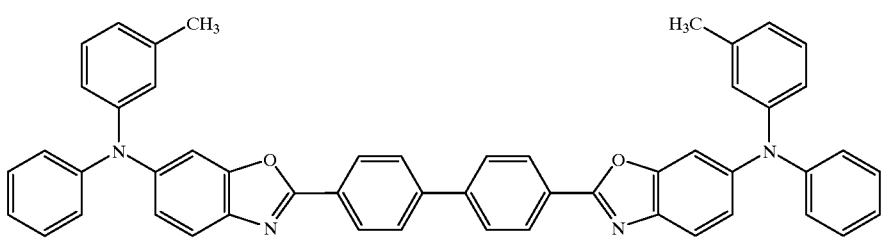
(27)

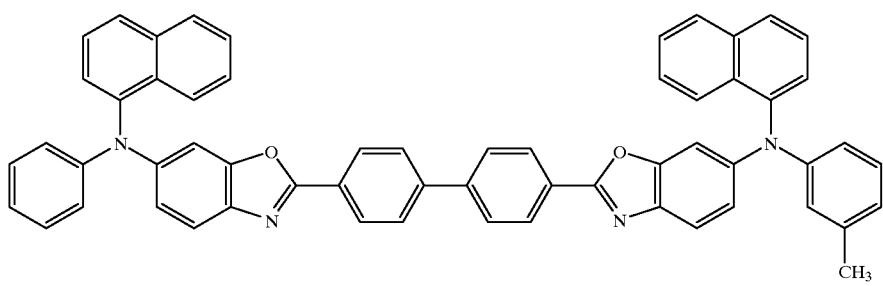
(28)
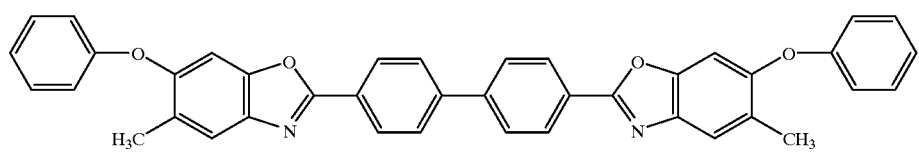
(29)
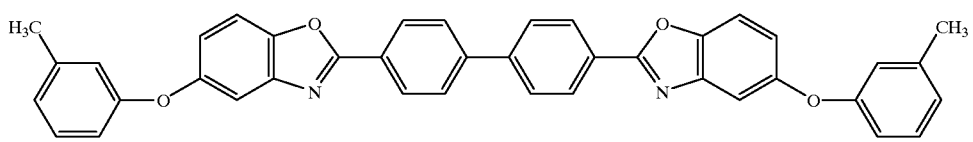
(30)
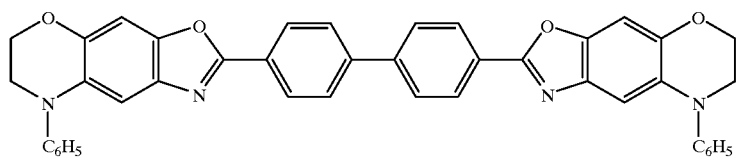
(31)
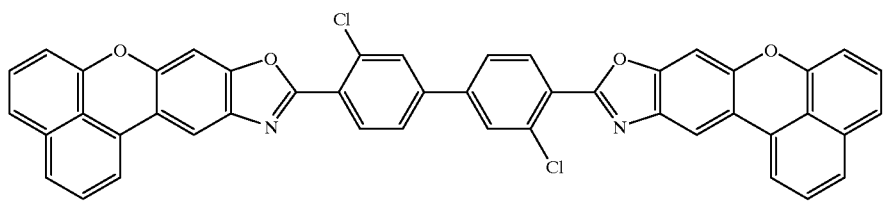
(32)
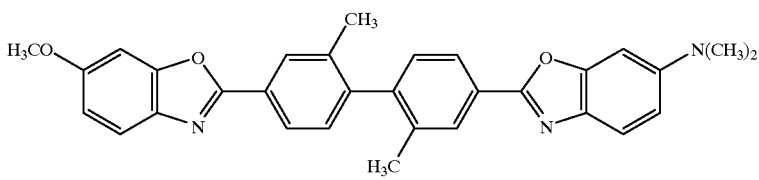
(33)
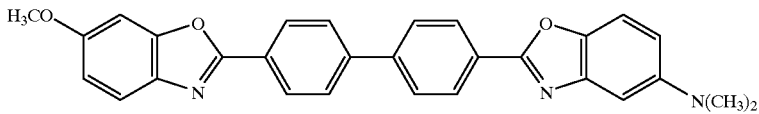
(34)
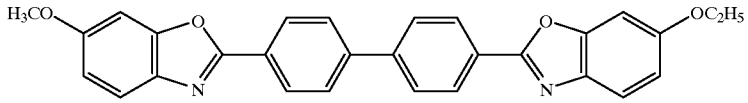
(35)

-continued
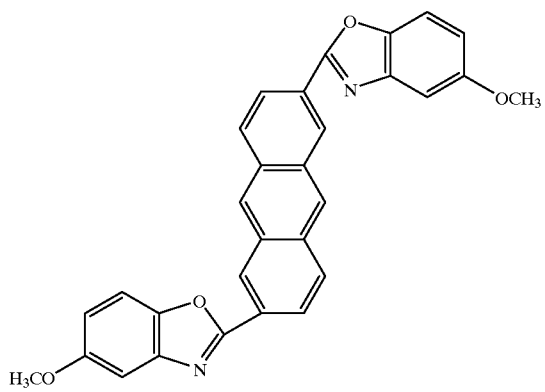
(36)
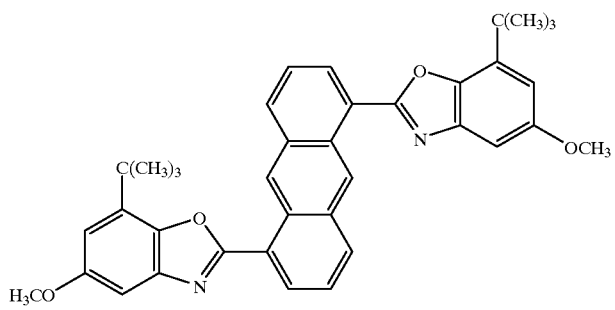
(37)
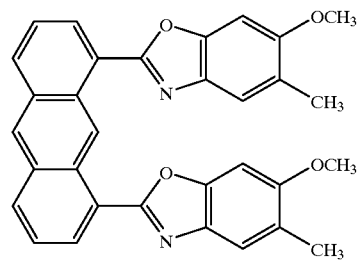
(38)
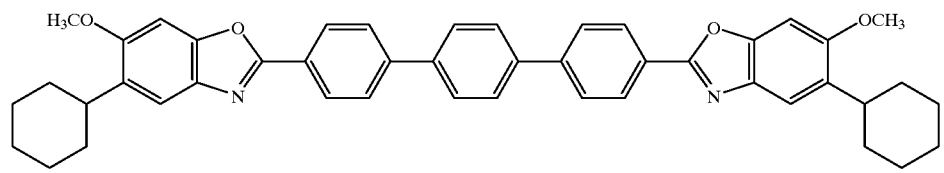
(39)
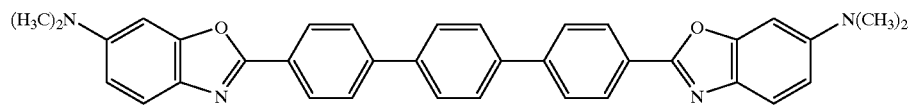
(40)
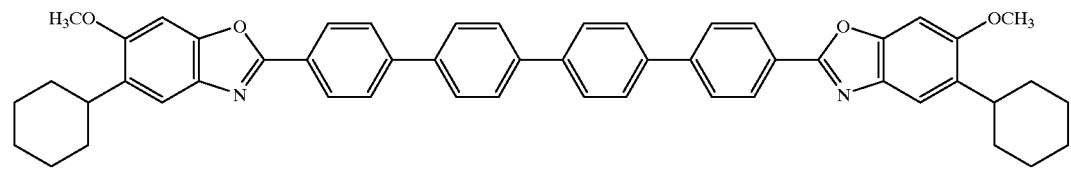
(41)
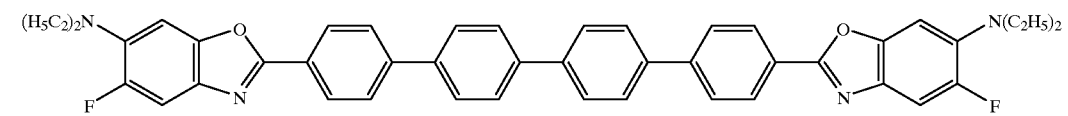
(42)

-continued
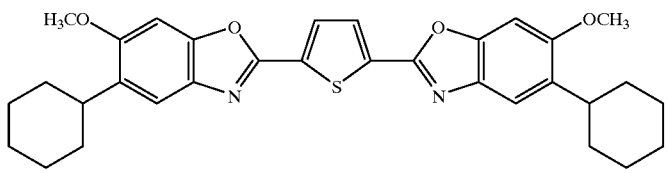
(43)
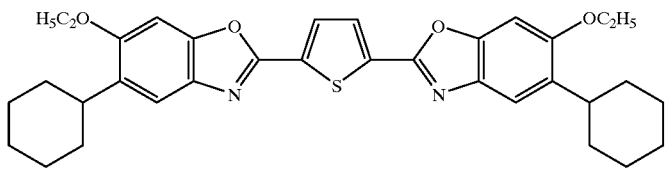
(44)
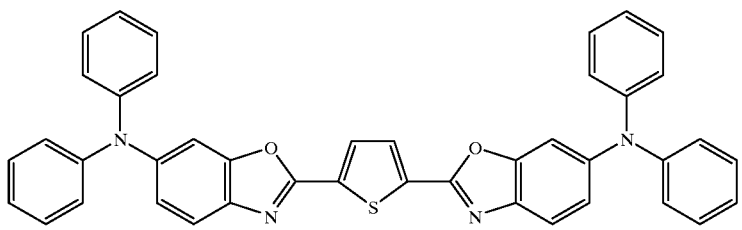
(45)
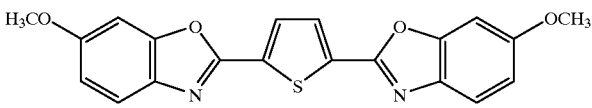
(46)
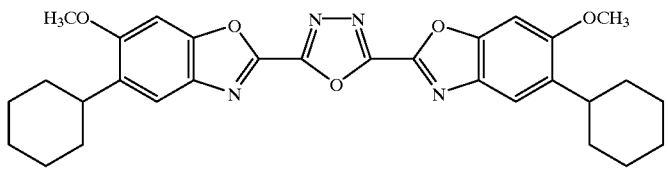
(47)
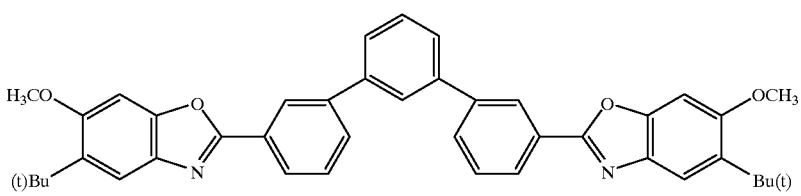
(48)
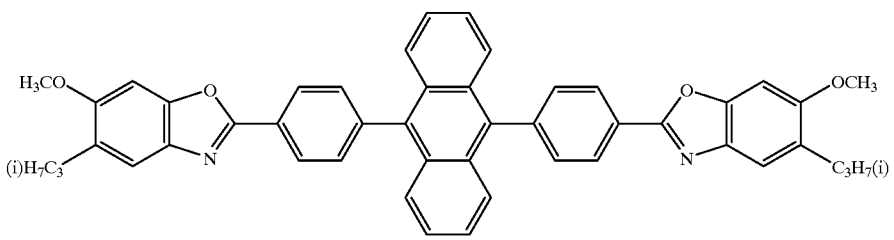
(49)
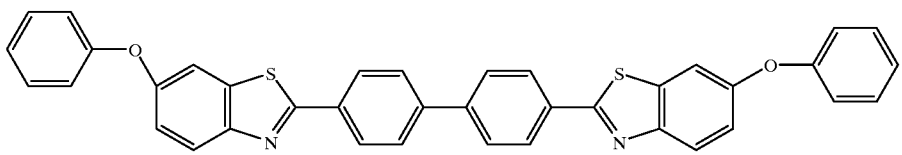
(50)

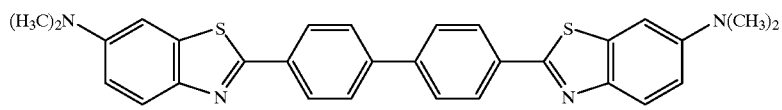
(51)
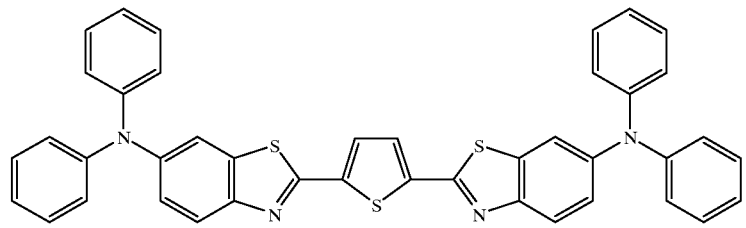
(52)
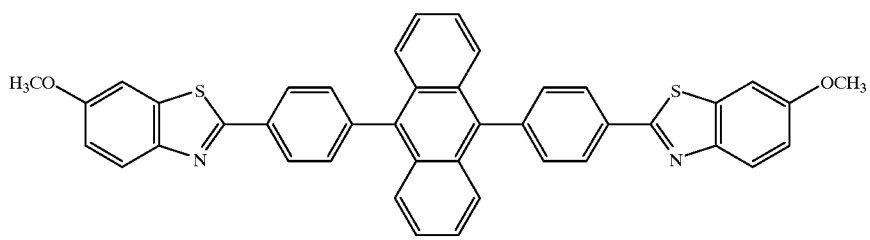
(53)
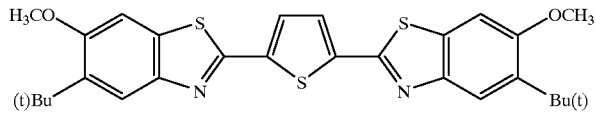
(54)
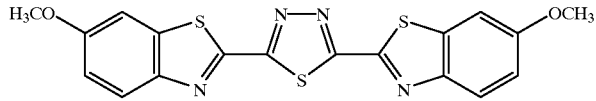
(55)
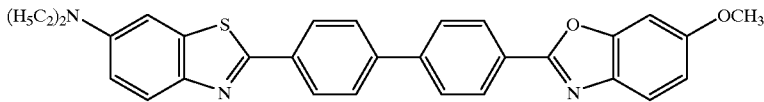
(56)
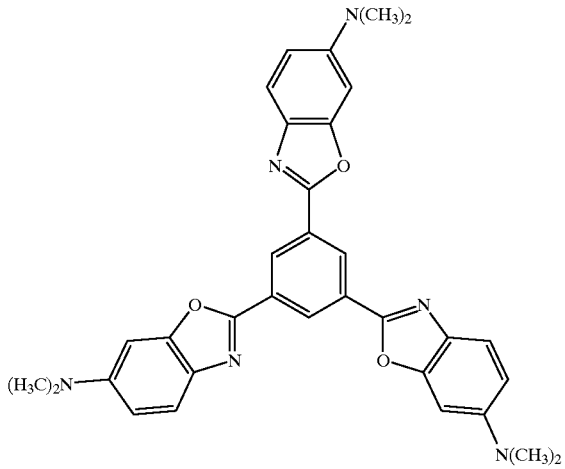
(57)

(58)
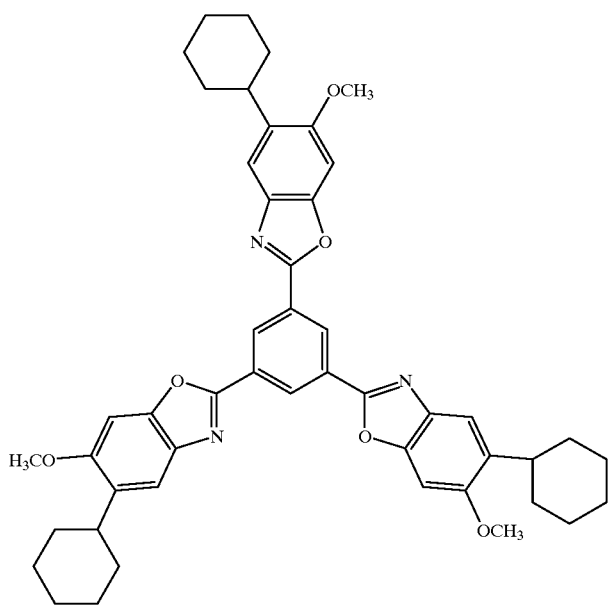
(59)
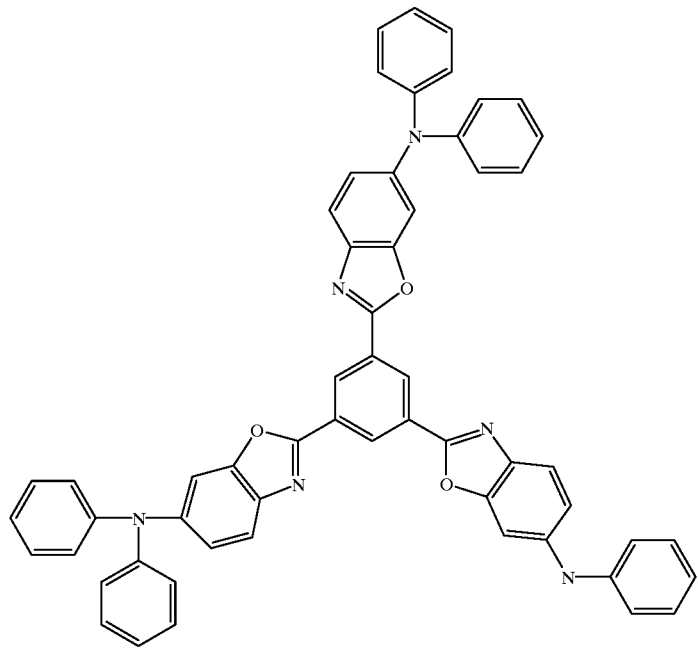

(60)
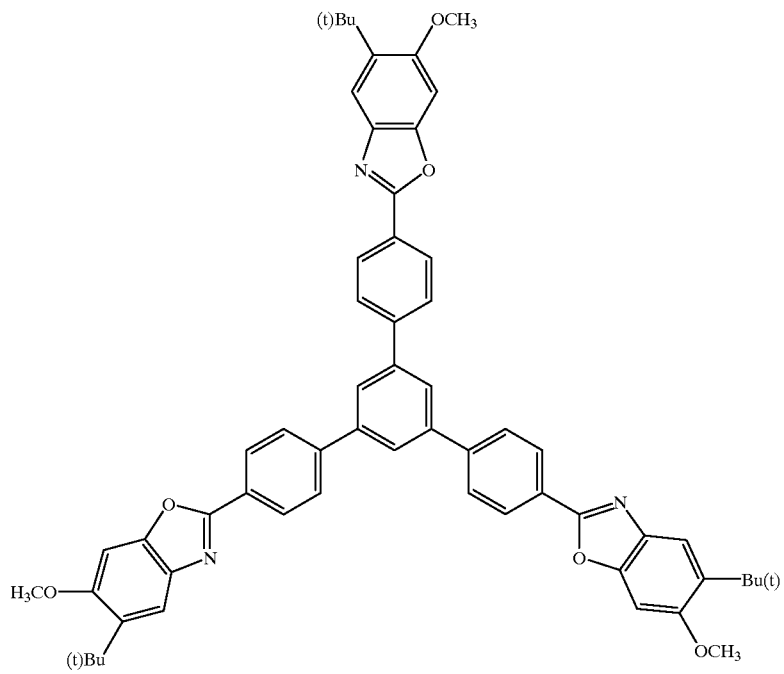
(61)
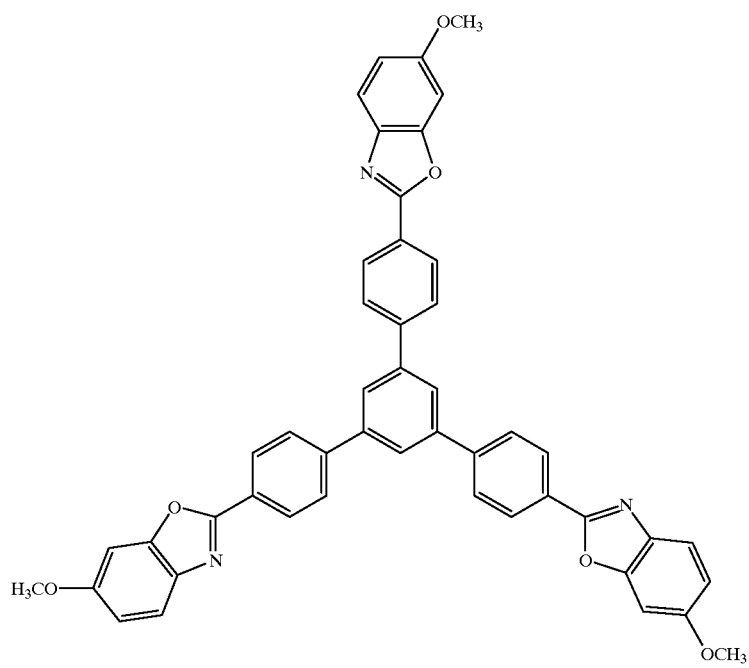

(62)
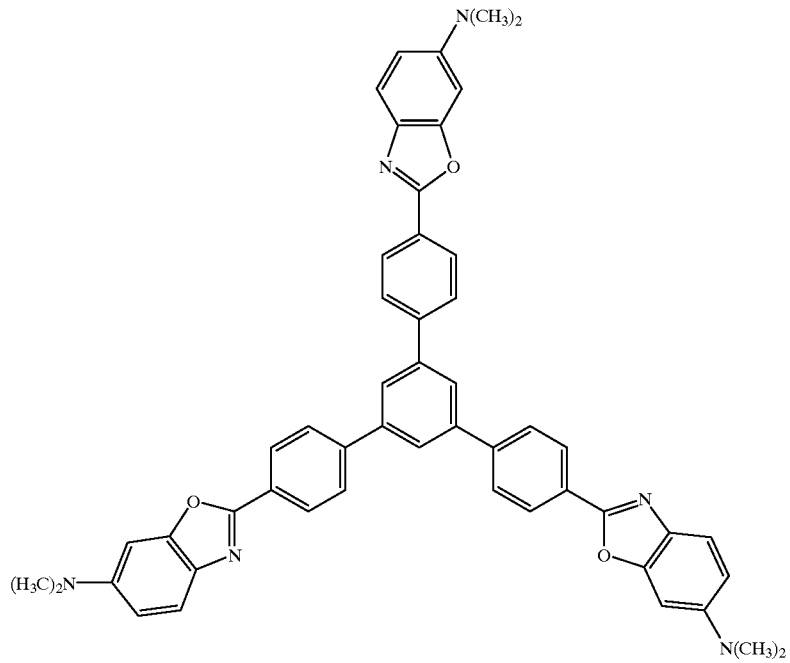
(63)
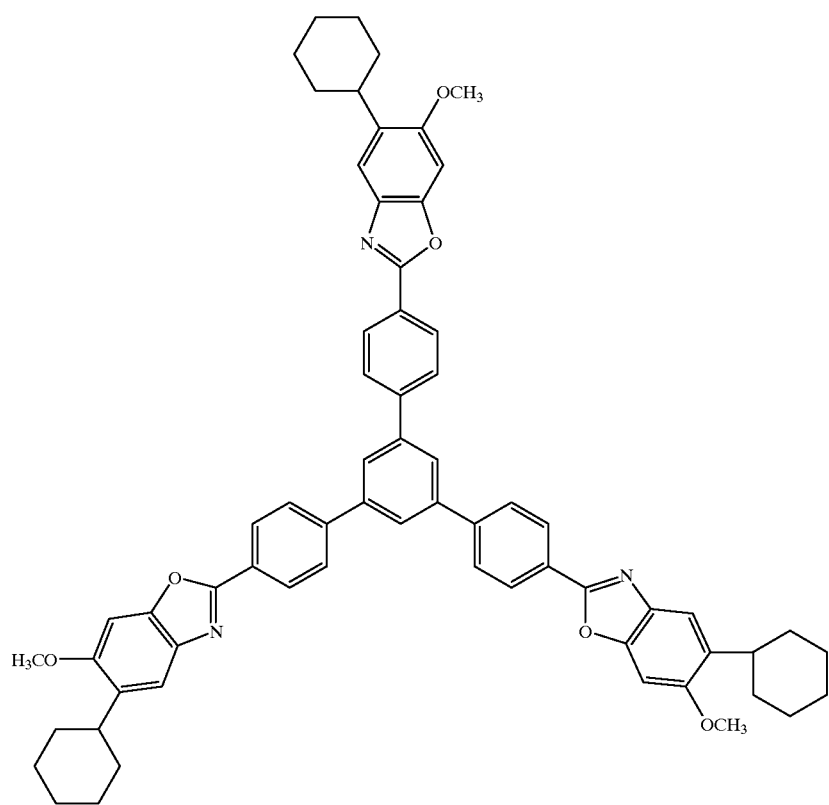

-continued
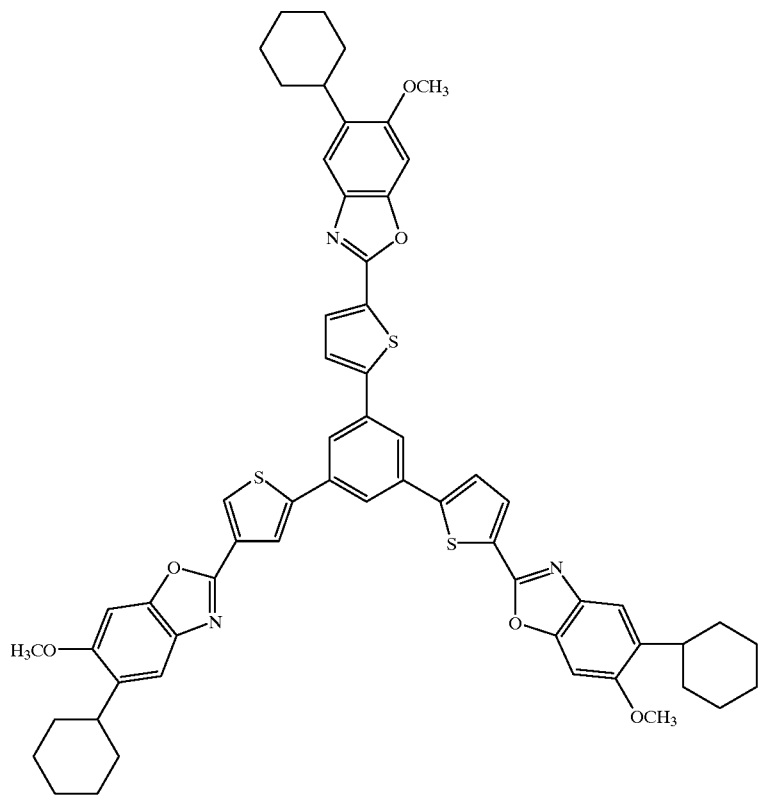
(64)
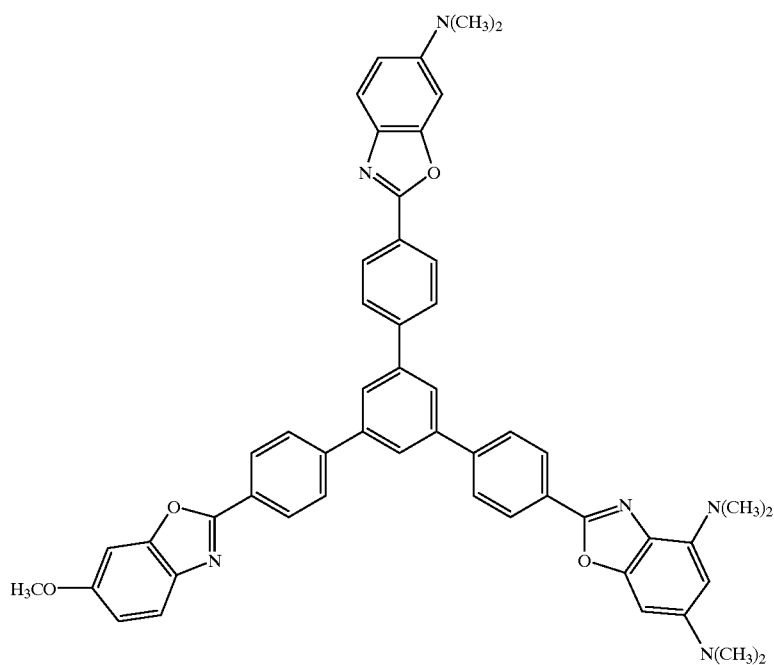
(65)

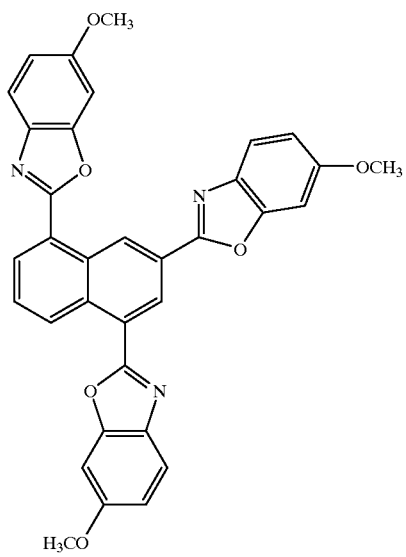
(66)
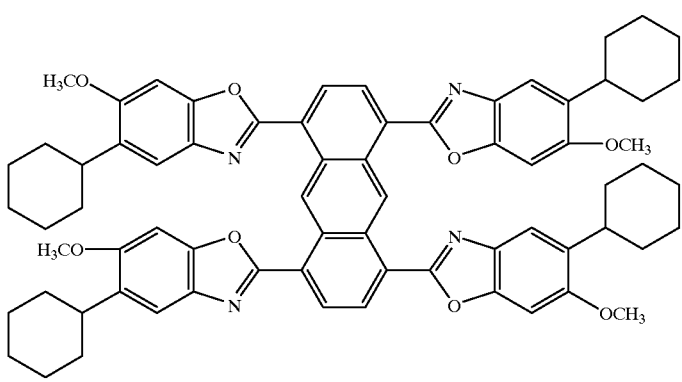
(67)
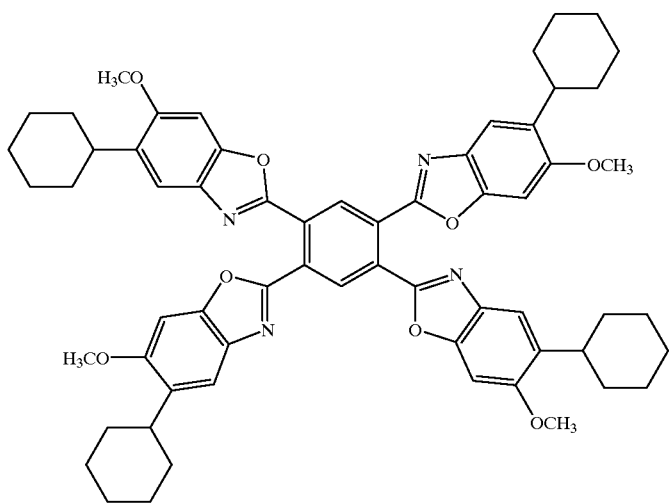
(68)

-continued
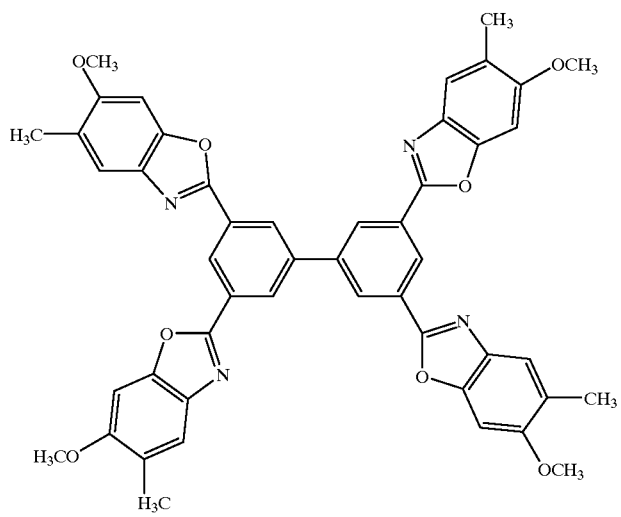
(69)
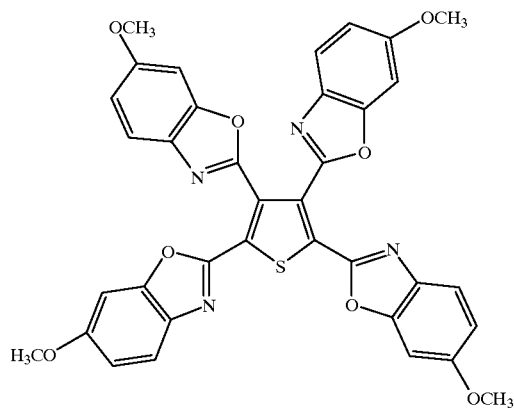
(70)
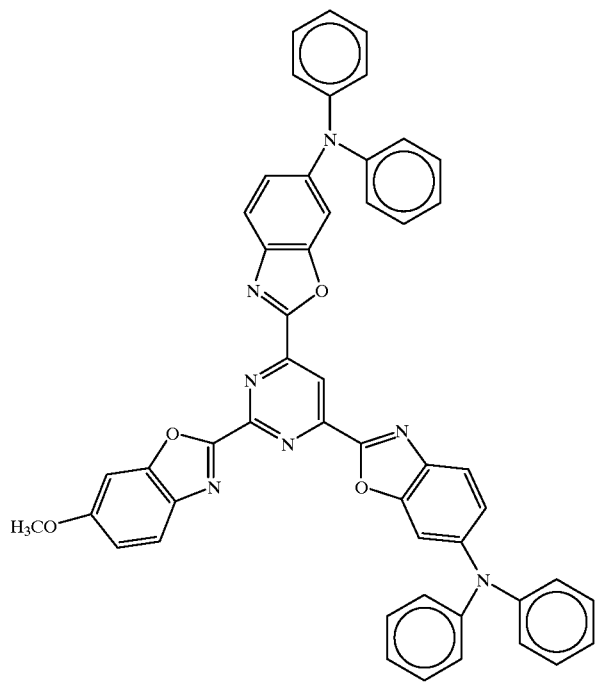
(71)

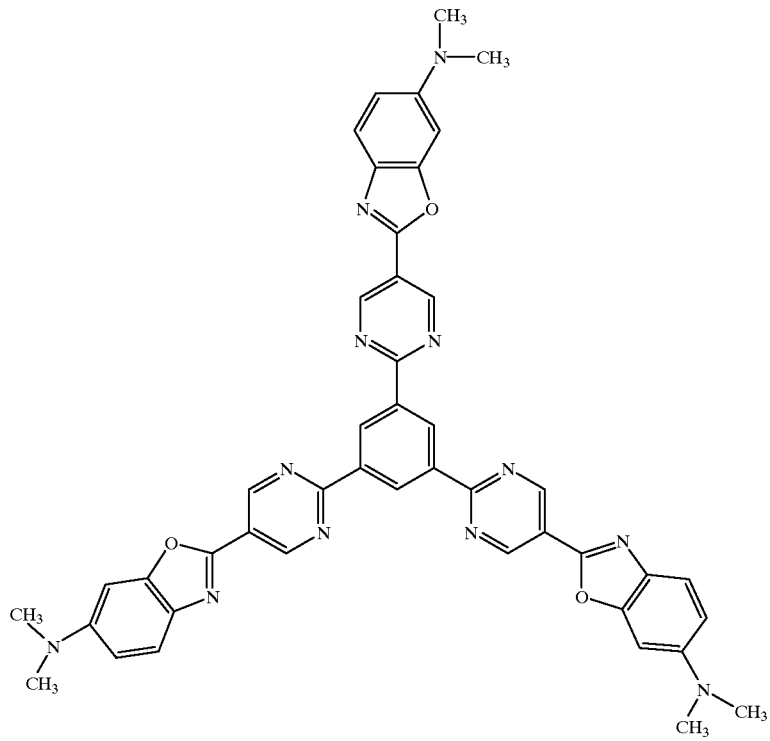
(72)
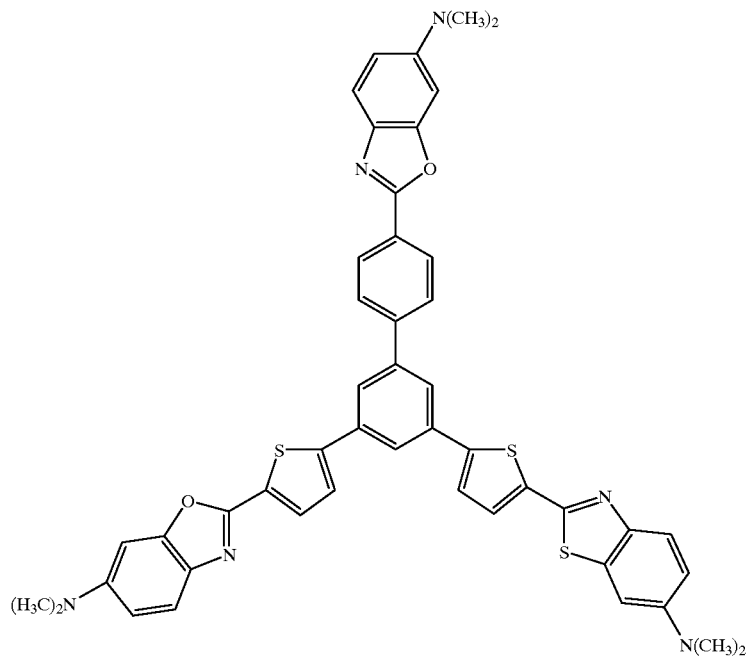
(73)

(74)
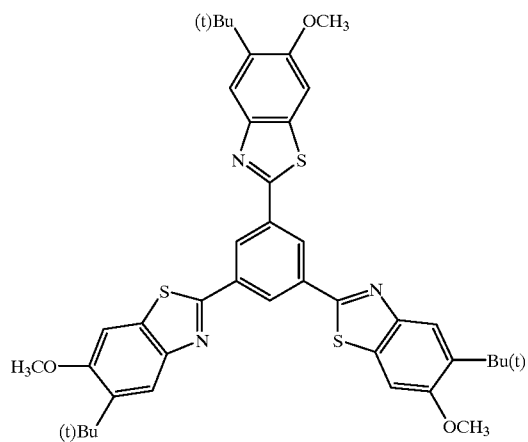
(75)
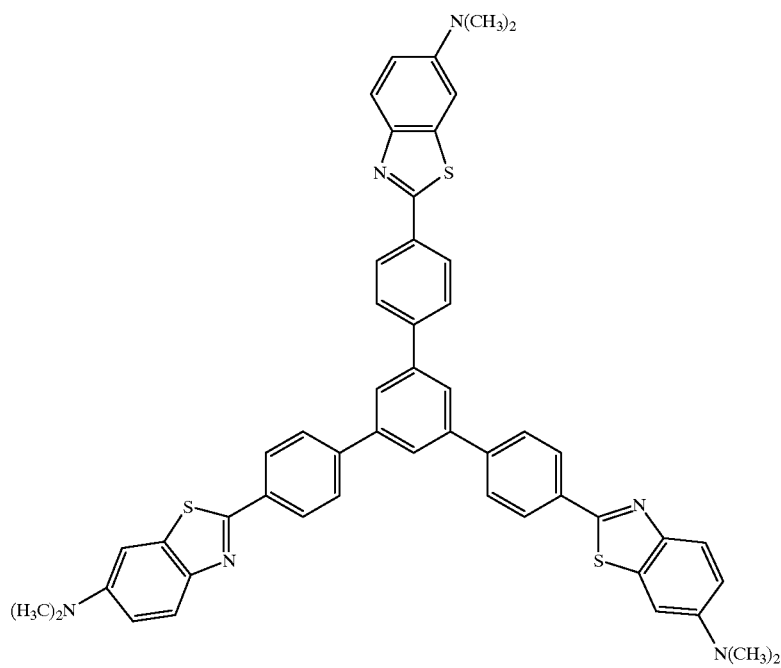

(76)
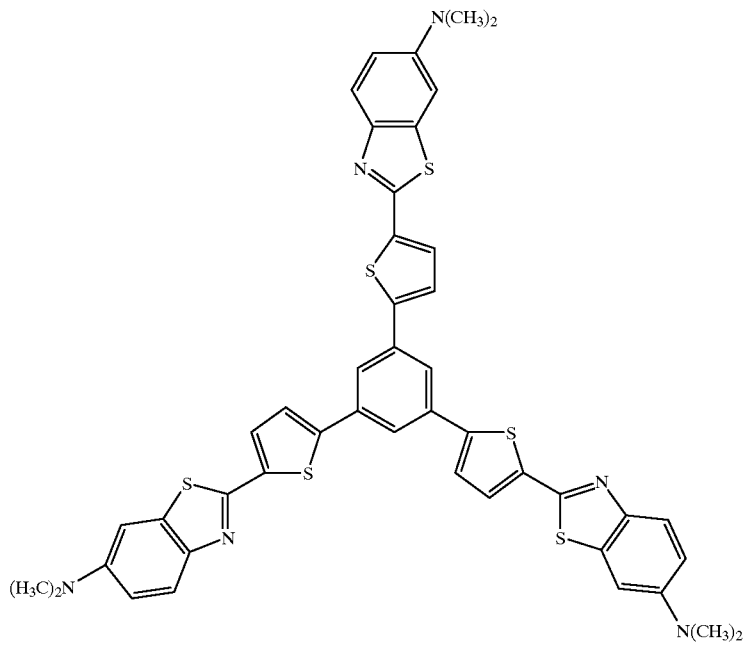
(77)
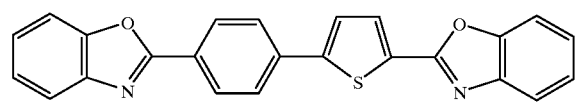
(78)
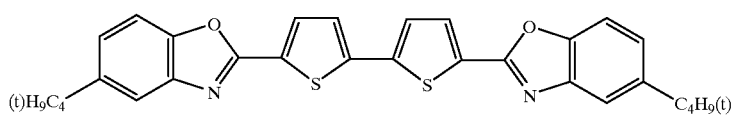
(79)
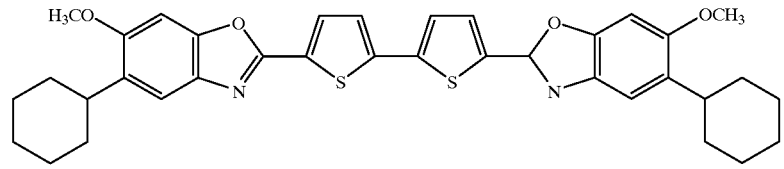
(80)
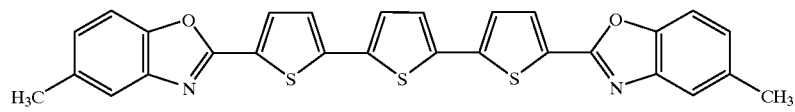
(81)
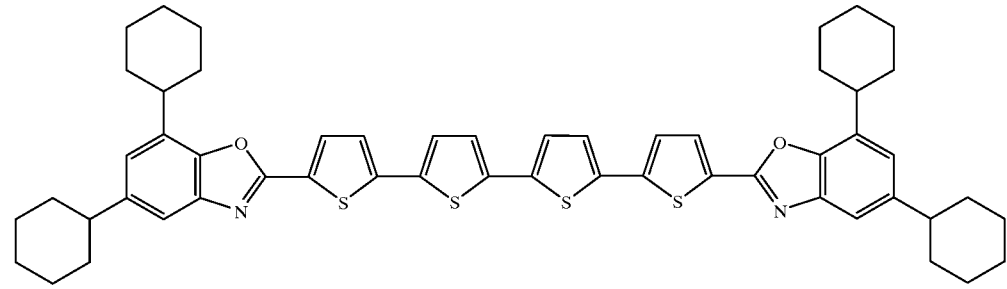

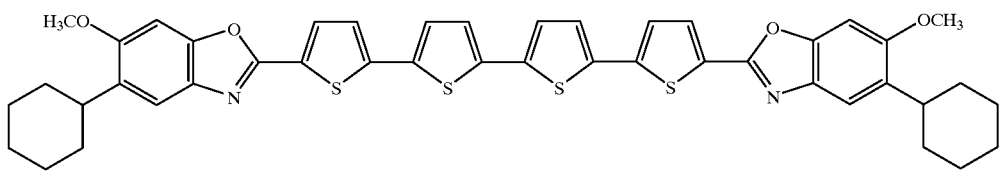
(82)
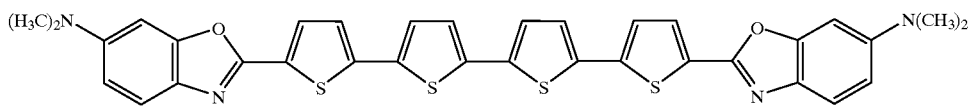
(83)
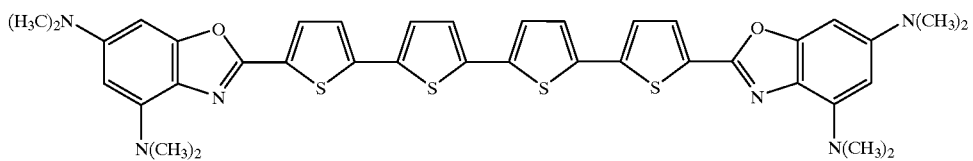
(84)
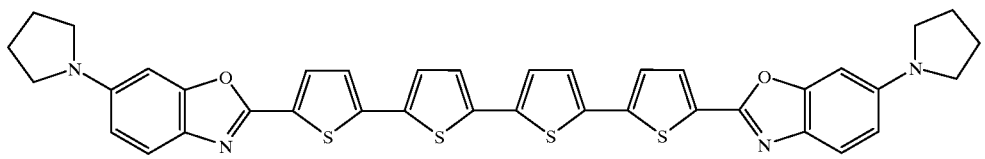
(85)
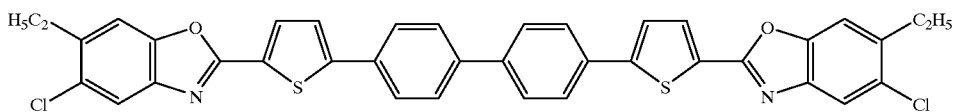
(86)
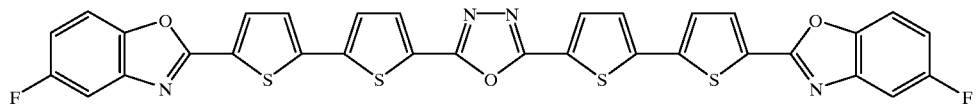
(87)
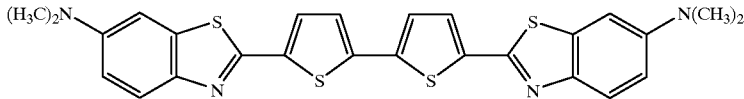
(89)
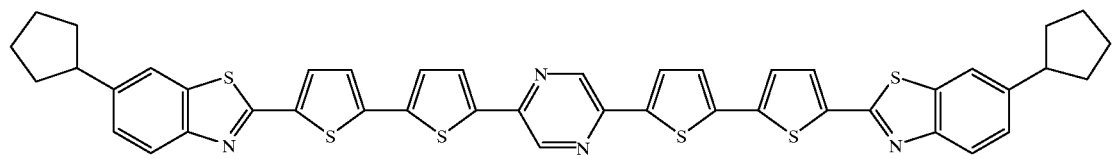
(90)
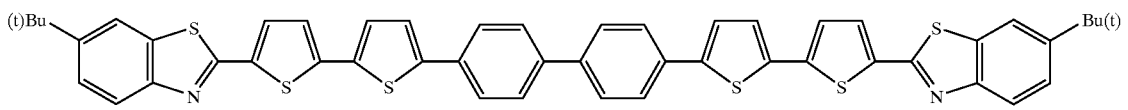
(91)

(92)

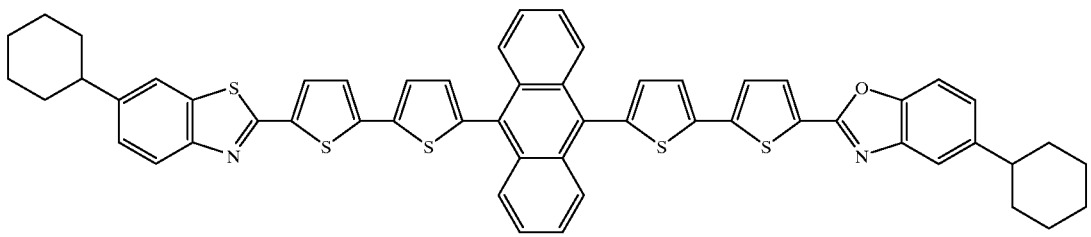

Compounds represented by each of formulae (I) to (VI) for use in the present invention can be synthesized basically according to methods given in, e.g., JP-B-44-23025 (the term "JP-B" as used herein means an "examined Japanese patent publication"), U.S. Pat. No. 3,449,257, J. Am. Chem, Soc., 94, 2414(1972), JP-B-48-8842, JP-A-53-6331 (the term "JP-A" as used herein means an "unexamined published Japanese patent application"), Helv. Chim. Acta., 63, 413(1980), or Liebigs, Ann. Chem., 1423(1982). Typical synthesis examples are given below.

SYNTHESIS EXAMPLE 1
Synthesis of Exemplified Compound (13)

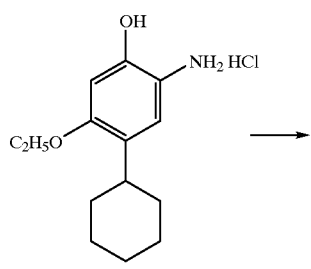

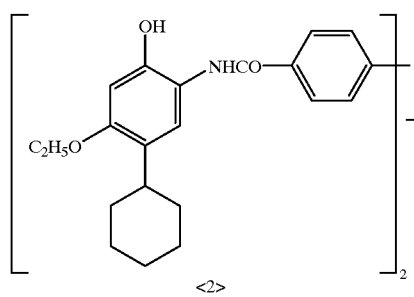

Exemplified Compound (13)

A solution of 2.3 g (8.4 mmol) of 4,41-biphenyl-dicarbonyl chloride in acetonitrile (100 ml) was stirred at room temperature. Thereto was added 5.0 g (18.4 mmol) of 2-amino-4-cyclohexyl-5-ethoxyphenol hydrochloride <1> (synthesized according to a method described in JP-A-56-100771). Thereto was then added dropwise 3.7 ml (26.9 mmol) of triethylamine. The resultant mixture was subsequently heated with refluxing for about 2 hours. After this reaction mixture was cooled to room temperature, water was added thereto. The resultant light-brown crystals precipitated were taken out by suction filtration and sufficiently washed with methanol. This crystalline reaction product was the amide <2>, which was obtained in a yield of 4.3 g (75.7%).

A solution of 4.0 g (5.9 mmol) of the compound <2> and 3.3 g (17.3 mmol) of p-toluenesulfonic acid monohydrate in toluene (100 ml) was heated with refluxing for about 16 hours while removing water from the reaction system using a Dean-Stark apparatus. Thereafter, the reaction mixture was allowed to cool to room temperature, upon which crystals precipitated. The crystals were taken out by suction filtration and washed with toluene to obtain yellow crystals. These crystals were transferred to a beaker, and saturated aqueous sodium hydrogen carbonate solution was added thereto. After this mixture was stirred, the solid matter was taken out by suction filtration, washed with water, and then dried. As a result, Exemplified Compound (13) was obtained as slightly greenish light-yellow crystals in an amount of 2.1 g (55%). Melting point, 259–260° C. (recrystallized from tetrahydrofuran).

SYNTHESIS EXAMPLE 2
Synthesis of Exemplified Compound (22)

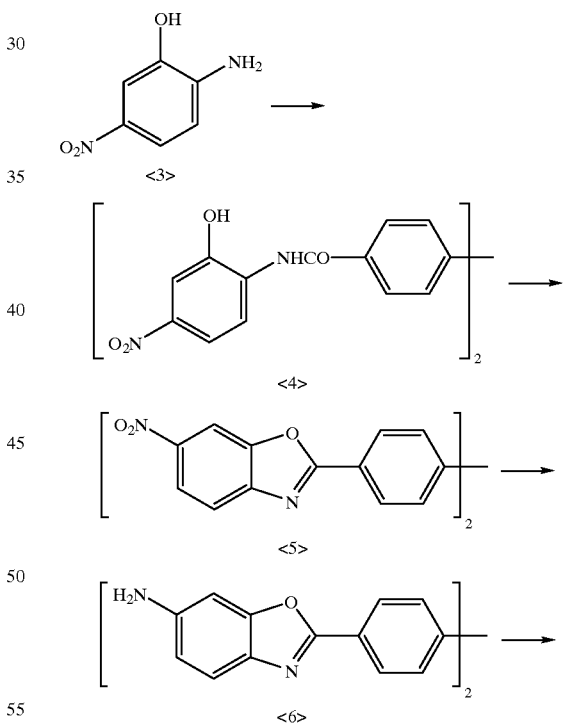

Exemplified Compound (22)

To a solution of 12.1 g (78.8 mmol) of 2-amino-5-nitrophenol <3> in acetonitrile (100 ml) was added 10.0 g (35.8 mmol) of 4,4'-biphenyldicarbonyl chloride at room temperature. This mixture was stirred. Thereto was added dropwise 8.0 g (78.8 mmol) of triethylamine. The resultant mixture was stirred for about 2 hours. The crystals thus precipitated were taken out by filtration, washed with acetonitrile, and then dried to obtain 17.0 g (92.3%) of compound <4> as yellow crystals.

To 15.0 g of the compound <4> were added 200 ml of DMI (1,3-dimethyl-2-imidazolidinone) and 100 ml of toluene. Thereto was added 16.6 g (87.5 mmol) of p-toluenesulfonic acid monohydrate. This mixture was heated with refluxing for about 15 hours, during which water was removed using a Dean-Stark apparatus. The reaction mixture was cooled to room temperature, and the crystals precipitated were taken out by filtration and dried to obtain 12.1 g (76.5%) of compound <5> as a yellow crystalline powder.

To 100 ml of isopropanol was added 5.8 g (105 mmol) of reduced iron. Thereto were added 0.6 g (10.5 mmol) of ammonium chloride and 30 ml of water. This mixture was heated with refluxing for about 30 minutes. The heating with refluxing was then stopped, and 5.0 g (10.5 mmol) of the compound <5> was added to the reaction mixture. Thereto was further added 300 ml of DMF (N,N-dimethylformamide). The resultant mixture was heated with refluxing for about 6 hours, subsequently cooled to about 50° C., and then filtered through Celite to remove the insoluble matter. The filtrate was concentrated with an evaporator to remove the isopropanol and water therefrom to obtain a residue containing compound <6>. To the residue were added 50 g (320 mmol) of iodoethane and 20 g (145 mmol) of potassium carbonate. This mixture was reacted at 65 to 75° C. for about 20 hours. Chloroform and water were added to the reaction mixture, and the resultant mixture was subjected to Celite filtration and then extraction. The extract was dried over anhydrous magnesium sulfate and was then filtered and concentrated to obtain a crystalline compound. Methanol was added thereto, and this mixture was stirred and then filtered with suction to obtain 3.8 g of yellow crystals containing Exemplified Compound (22) as the main component. The yellow crystals were purified by silica gel column chromatography (eluted with chloroform) and then recrystallized from tetrahydrofuran. As a result, pure Exemplified Compound (22) could be obtained in an amount of 2.0 g (35.9%). Melting point, 232–233° C.

SYNTHESIS EXAMPLE 3
Synthesis of Exemplified Compound (41)

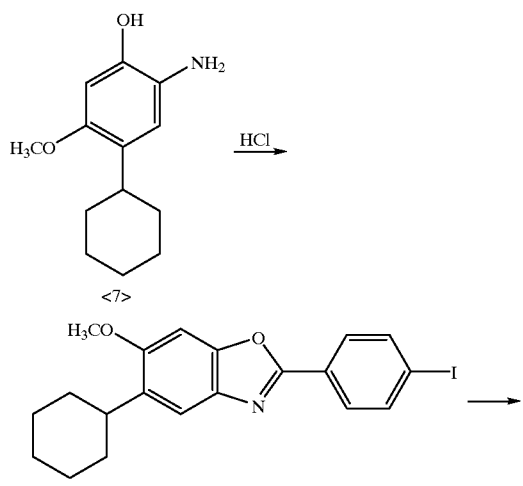

Exemplified Compound (41)

In 100 ml of NMP (N-methylpyrrolidone) was dissolved 17.3 g (70 mmol) of 4-iodobenzoic acid. This solution was cooled to about 10° C. with ice water and stirred. Thereto was added dropwise 5.9 ml (81 mmol) of thionyl chloride. After the addition, the resultant mixture was stirred for about 2 hours. Subsequently, 15.0 g (58 mmol) of compound <7> was added to the reaction mixture, which was then stirred for about 2 hours. Water was added to the reaction mixture, which was then extracted twice with chloroform. The extracts were put together, washed with an aqueous sodium hydroxide solution (~pH 8) and with saturated aqueous common salt solution, dried with anhydrous magnesium sulfate, and then filtered and concentrated. To the concentrate, which contained NMP, were added 100 ml of toluene and 2.2 g (12 mmol) of p-toluenesulfonic acid monohydrate. This mixture was dehydrated while removing toluene using a Dean-Stark apparatus. After most of the toluene was removed, 100 ml of chlorobenzene was added and the mixture was heated with refluxing for about 15 hours. Water and chloroform were added to the reaction mixture, and the resultant mixture was extracted to obtain a crystalline compound. Methanol was added to the crystals, and this mixture was filtered to thereby obtain 21.6 g (86.1%) of compound <8> as a yellowish light-brown substance.

Into a flask were introduced 5 g (11.5 mmol) of the compound <8>, 1.4 g (5.8 mmol) of 4,4'-biphenyldiboronic acid, and 0.1 g (0.087 mmol) of tetrakis(triphenylphosphine)-palladium. Thereto were added 11.5 ml (23 mmol) of 2 M aqueous sodium carbonate solution and 80 ml of toluene. The unit "M" as used herein means a molarity as defined as the number of moles of solute per kilogram of solvent. This mixture was heated with refluxing in a nitrogen stream. Since the ingredients were not well mixed up, 90 ml of DMF and 30 ml of water were added thereto. The resultant mixture was heated with refluxing for about 20 hours. The reaction mixture was cooled to room temperature and water was added thereto, upon which crystals precipitated. The crystals were taken out by filtration and washed with methanol. The crystals obtained were extracted with chloroform using a Soxhlet extractor. As a result, Exemplified Compound (41) could be obtained as pure crystals in an amount of 2.7 g (61.4%). Melting point, 275–276° C.

SYNTHESIS EXAMPLE 4
Synthesis of Exemplified Compound (43)

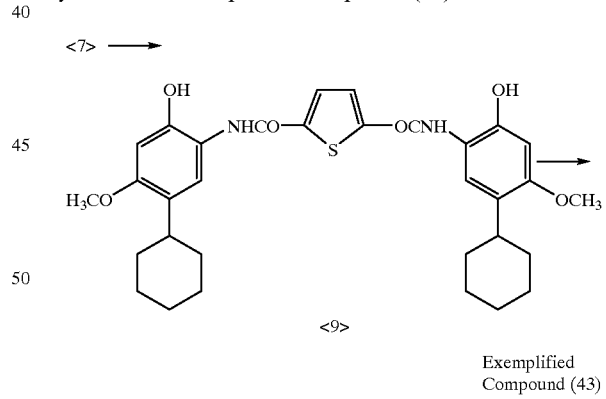

Exemplified Compound (43)

An NMP solution of 6.7 g (38.8 mmol) of 1,5-thiophenedicarboxylic acid was reacted with 3.4 ml (46.6 mmol) of thionyl chloride in the same manner as in Synthesis Example 3 to form an acid chloride. To the reaction mixture was added 20 g (77.6 mmol) of compound <7>. This mixture was stirred at room temperature. Subsequently, 10.8 ml (77.6 mmol) of triethylamine was added thereto dropwise. The resultant mixture was stirred for about 30 minutes, subsequently heated to about 60° C., further reacted for about 1 hour, and then cooled to room temperature. Water was added thereto, and this mixture was extracted with ethyl acetate. The extract was dried over anhydrous magnesium sulfate and then concentrated to obtain a crystalline residue. Chloroform was added to the residue, and the resultant mixture was stirred and subjected to filtration and drying to thereby obtain 15.7 g (70%) of compound <9> as a yellow crystalline powder. Compound <9> is soluble in ethyl acetate and tetrahydrofuran but sparingly soluble in chloroform.

To a solution of 8.2 g (14.2 mmol) of the compound <9> and 0.54 g (2.83 mmol) of p-toluenesulfonic acid monohydrate in chlorobenzene (150 ml) was added 10 ml of DMI. This mixture was heated with refluxing for about 40 hours, during which 0.54 g of p-toluenesulfonic acid monohydrate was added twice to the reaction mixture because the reaction was slow. Water was added thereto, and this mixture was extracted with a large amount of chloroform. The extract was dried over anhydrous magnesium sulfate and then concentrated to obtain brown crystals. These crystals were dissolved in chloroform with slight heating and then purified with a column packed with a large amount of silica gel. The orange crystals thus obtained were recrystallized from a chloroform/ethanol solvent. As a result, Exemplified Compound (43) could be obtained as an orange crystalline powder in an amount of 4.8 g (62%). Melting point, 276–278° C.

SYNTHESIS EXAMPLE 5
Synthesis of Exemplified Compound (57)

In NMP (100 ml) was dissolved 11.7 g (76.9 mmol) of 2-amino-5-dimethylamino-4-t-butylphenol. Thereto was added 6.8 g (25.6 mmol) of 1,3,5-benzenetricarbonyl chloride at room temperature. This mixture was stirred for about 1 hour and then allowed to stand overnight. Thereto were added 14.6 g (76.9 mmol) of p-toluenesulfonic acid monohydrate and 100 ml of toluene. The resultant mixture was heated with refluxing for about 15 hours while removing water using a Dean-Stark apparatus. The reaction mixture was allowed to stand at room temperature overnight, upon which crystals precipitated. Methanol was added thereto, and the resultant mixture was subjected to filtration and drying to thereby obtain 14.7 g of almost pure Exemplified Compound (57) as a colorless crystalline powder. This reaction product was recrystallized from a tetrahydrofuran/methanol solvent. As a result, pure Exemplified Compound (57) could be obtained in an amount of 12.8 g (89.5%). Melting point, >300° C.

SYNTHESIS EXAMPLE 6
Synthesis of Exemplified Compound (63)

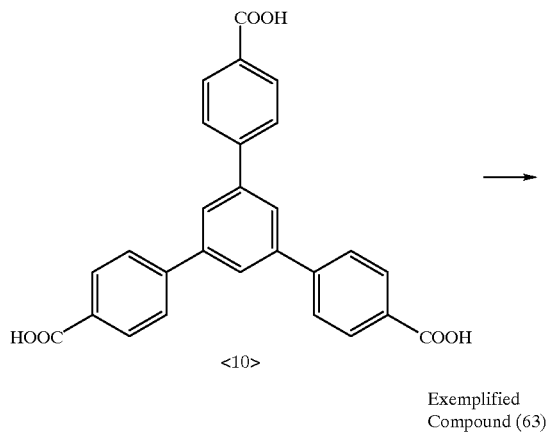

Exemplified Compound (63)

An acid chloride was synthesized in the same manner as in Synthesis Example 3 from 2.3 g (5.2 mmol) of compound <10> and 2.2 g (18.7 mmol) of thionyl chloride. To the reaction mixture was added 4.8 g (18.7 mmol) of compound <7>. This mixture was stirred at 70 to 90° C. for about 10 hours and then allowed to stand at room temperature overnight. To the reaction mixture were added 0.7 g (3.8 mmol) of p-toluenesulfonic acid monohydrate and 100 ml of chlorobenzene. This mixture was heated with refluxing for about 13 hours. The chlorobenzene and the NMP were removed as much as possible from the reaction mixture under reduced pressure, and the resultant residue was purified by silica gel chromatography and then recrystallized from a tetrahydrofuran/ethanol solvent. As a result, Exemplified Compound (63) could be obtained as colorless crystals in an amount of 2.7 g (52%). Melting point, 230–233° C.

SYNTHESIS EXAMPLE 7
Synthesis of Exemplified Compound (79)

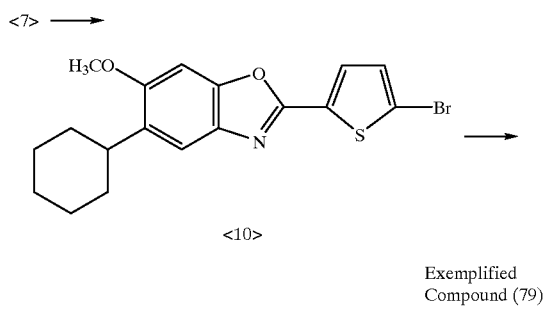

Exemplified Compound (79)

To a solution of 10 g (48 mmol) of 4-bromothiophene-2-carboxylic acid in toluene (100 ml) was added 5.3 ml (72 mmol) of thionyl chloride. This mixture was heated with refluxing for about 3 hours. Thereafter, a drop of DMF was added thereto and the reaction mixture was heated with refluxing for further 2 hours. After the resultant reaction mixture was concentrated under reduced pressure, 12.4 g (48 mmol) of compound <7>, 100 ml of toluene, and 50 ml of NMP were added thereto. This mixture was first stirred at 20° C., subsequently gradually heated to 100° C., and heated with refluxing for about 30 minutes. Thereto was then added 9.1 g (48 mmol) of p-toluenesulfonic acid monohydrate. The resultant mixture was heated with refluxing for about 10 hours while removing water using a Dean-Stark apparatus. The reaction mixture was cooled to room temperature, and water was then added thereto. This mixture was extracted with chloroform three times, and the extract was dried over anhydrous magnesium sulfate and then concentrated under reduced pressure to thereby obtain a crystalline compound. Methanol and ethyl acetate were added thereto, and this mixture was stirred and then filtered. The solid matter obtained was dried to thereby obtain 15.1 g (80%) of almost pure compound <11>.

To a solution of 5.0 g (12.7 mmol) of the compound <11> and 200 mg (0.5 mmol) of bis(triethylphosphine)nickel chloride in NMP (50 ml) were added 830 mg (12.2 mmol) of zinc and 4.2.g (25.4 mmol) of potassium iodide. In a nitrogen stream, this mixture was gradually heated from room temperature to about 70° C., and stirred at 70° C. for about 10 hours. Water was added to the resultant reaction mixture, which was then extracted with chloroform. The extract was dried and concentrated. The resultant residue was purified by silica gel column chromatography and recrystallized from a tetrahydrofuran/methanol solvent. As a result, Exemplified Compound (79) was obtained in an amount of 1.4 g (35%). Melting point, 297–300° C.

Figure 2:
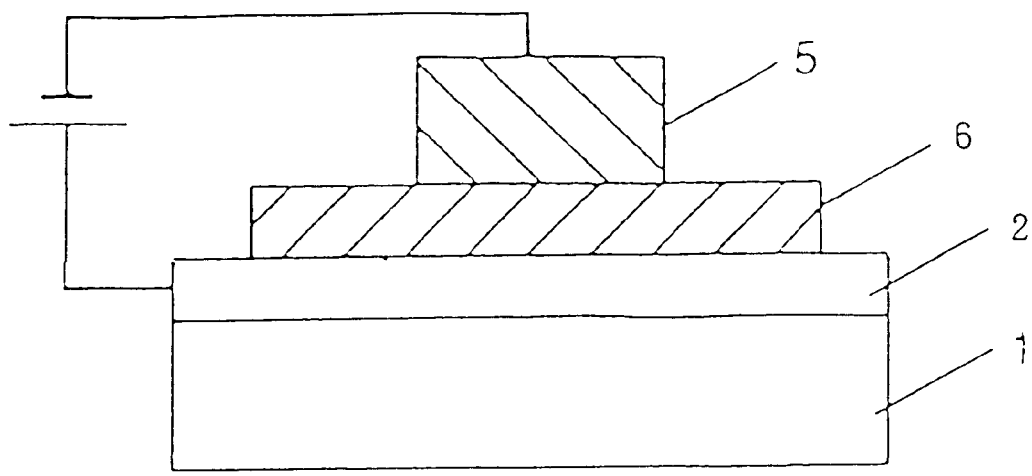
FIG. 2 is a view illustrating the constitution of an organic electroluminescent element of the present invention.

The organic compounds according to the present invention can be used alone to form an organic-compound layer. However, since these compounds show exceedingly intense fluorescence even in solutions, they effectively function also as dopants, i.e., as the guests in host-guest systems. In the case of an organic compound according to the present invention which has a concentration quenching, it can be used in a layer of a mixture thereof with other organic compounds as a dopant in a concentration as extremely low as up to several percents by mole. The organic compounds shown as examples of the organic compounds for use in the present invention each can be used as a luminescent layer in a laminated structure together with another organic compound having a luminescent region, or can be used in a laminated structure comprising a layer of a mixture thereof with another organic compound having a luminescent region, or can be used in a constitution comprising a dispersion thereof in a polymer. Furthermore, the organic compounds according to the present invention each can be used in a laminated structure comprising a layer thereof and a layer of either an organic substance having electron- or hole-transporting properties or a luminescent material having electron- or hole-transporting properties and having a luminescent region, or can be used in a layer comprising a mixture thereof with either the organic substance or the luminescent material, or can be used in a constitution comprising a dispersion of the organic compound according to the present invention and the organic substance or luminescent material in a polymer. The organic electroluminescent element of the present invention has a constitution comprising a substrate 1 and, formed thereover, at least an anode 2 for injecting holes, at least one organic-compound layer 6, and a cathode 5 for injecting electrons, as shown in FIG. 2. However, the organic-compound layer necessitates having a luminescent region. In the case of an organic electroluminescent element containing only a luminescent layer as the organic-compound layer, an organic compound according to the present invention is contained in the luminescent layer and contributes to luminescence. If a luminescent layer deficient in hole-transporting properties is used, a laminated structure can be selected which contains a hole-transporting layer interposed between the luminescent layer and the anode such as ITO. If a luminescent layer deficient in electron-transporting properties is used, a laminated structure can be selected which contains an electron-transporting layer interposed between the luminescent layer and the cathode. In these cases, an organic compound according to the present invention can be incorporated also into the hole-transporting layer and the electron-transporting layer. It is possible to select a constitution in which the luminescent layer contains materials having hole-transporting and electron-transporting properties. In this case also, an organic compound according to the present invention can be incorporated into the luminescent layer. From the standpoint of enabling holes and electrons to be efficiently injected and recombined with each other, an organic electroluminescent element generally has a laminated structure in which functions are allotted to the individual layers. Materials for use in each layer will be shown below.

Generally employed hole-transporting materials include aromatic diamine compounds such as N,N'-diphenyl-N,N'-bis(3-methylphenyl)-1,1'-diphenyl-4,4'-diamine (TPD). Other examples of compounds used as hole-transporting materials include porphyrin compounds given in JP-A-4-129191, JP-A-4-255692, and JP-A-4-132189, such as porphine, copper tetraphenylporphine, phthalocyanine, copper phthalocyanine, and titanium phthalocyanine oxide; aromatic tertiary amines such as 1,1-bis{4-(di-p-tolylamino) phenyl}cyclohexane, 4,4',4"-trimethyltriphenylamine, N,N, N',N'-tetrakis(p-tolyl)-p-phenylenediamine, 1-(N,N-di-p-tolylamino)naphthalene, 4,4,-bis(dimethylamino)-2,2'-dimethyltriphenylmethane, N,N,N',N'-tetraphenyl-4,4'-diaminobiphenyl, N,N'-diphenyl-N,N'-di-m-tolyl-4,4'-diaminobiphenyl, and N-phenylcarbazole; stilbene compounds such as 4-di-p-tolylaminostilbene and 4-(di-p-tolylamino)-4'-[4-di-p-tolylamino)styryl]stilbene; and other compounds including triazole compounds, oxadiazole compounds, imidazole compounds, polyarylalkane compounds, pyrazoline compounds, pyrazolone compounds, phenylenediamine compounds, arylamine compounds, amino-substituted chalcone compounds, oxazole compounds, styrylanthracene compounds, fluorenone compounds, hydrazone compounds, silazane compounds, polysilane/aniline copolymers, high-molecular oligomers, styrylamine compounds, aromatic dimethylidyne compounds, and poly(3-methylthiophene). Hole-transporting materials may also be used in the form of a dispersion thereof in a polymer, e.g., a polycarbonate.

The organic compounds according to the present invention each can be added as a dopant to an organic material showing fluorescence to form a luminescent layer based on a guest-host system. An example of use of an organic compound according to the present invention as a dopant in a mixture layer as a part of a luminescent layer is in combination with a luminescent material having electron-transporting properties, e.g., Alq. Because of its excellent film-forming properties and electron-transporting properties, Alq can be used not only as a luminescent layer or as an electron-transporting layer interposed between a luminescent layer and a cathode but also to form a layer comprising a mixture thereof with a luminescent layer. Furthermore, the compounds used as luminescent materials for organic electroluminescent elements mostly have electron-transporting properties and can be used in combination with organic compounds according to the present invention as an electron-transporting layer or a mixture layer. Examples of such compounds for use as luminescent materials include fluorescent brighteners such as those given in JP-A-4-255692, e.g., benzothiazole compounds, benzimidazole compounds, and benzoxazole compounds, oxinoid metal chelate compounds, and styrylbenzene compounds. Typical examples of the fluorescent brighteners include benzoxazole compounds such as 2,5-bis-(5,7-di-t-pentyl-2-benzoxazolyl)-1,3,4-thiadiazole, 4,4'-bis(5,7-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis([5-α,α-dimethylbenzyl]-2-benzoxazolyl)thiophene, 2,5-bis [5,7-di(2-methyl-2-butyl)-2-benzoxazolyl]-3,4-diphenylthiophene, 2,5-bis (5-methyl-2-benzoxazolyl)thiophene, 4,4'-bis(2-benzoxazolyl)-biphenyl, 5-methyl-2-[2-[4-(5-methyl-2-benzoxazolyl) phenyl]-vinyl]benzoxazole, and 2-[2-(4-chlorophenyl) vinyl]naphtho-[1,2-d]oxazole; benzothiazole compounds such as 2,2'-(p-phenylenedivinylene)bisbenzothiazole; and benzimidazole compounds such as 2-[2-[4-(2-benzoimidazolyl)phenyl]vinyl]-benzimidazole and 2-[2-(4-carboxyphenyl)vinyl]benzimidazole.

Examples of the oxinoid metal chelate compounds include 8-hydroxyquinoline metal complexes such as tris(8-quinolinol)aluminum, bis(8-quinolinol)magnesium, bis (benzo-[f]-8-quinolinol)zinc, bis(2-methyl-8-quinolinolato) aluminum oxide, tris(8-quinolinol)indium, tris(5-methyl-8-quinolinol)-aluminum, 8-quinolinollithium, tris(5-chloro-8-quinolinol)gallium, bis(5-chloro-8-quinolinol)calcium, and poly[zinc(II) bis(8-hydroxy-5-quinolinonyl)methane]; and dilithium epindolidione. Examples of the styrylbenzene compounds include 1,4-bis(2-methylstyryl)benzene, 1,4-(3-methylstyryl)benzene, 1,4-bis(2-methylstyryl)benzene, 1,4-(3-methylstyryl)benzene, 1,4-bis(4-methylstyryl)benzene, distyrylbenzene, 1,4-bis(2-ethylstyryl)benzene, 1,4-bis(3-ethylstyryl)benzene, and 1,4-bis(2-methylstyryl)-2-methylbenzene. Distyrylpyrazine compounds are also used, and typical examples thereof include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl) pyrazine, 2,5-bis[2-(4-biphenyl)vinyl]pyrazine, and 2,5-bis

[2-(1-pyrenyl)vinyl]pyrazine. Also usable are naphthalimide compounds, perylene compounds, oxadiazole compounds, aldazine compounds, cyclopentadiene compounds, styrylamine compounds, coumarin compounds, aromatic dimethylidyne compounds, and other compounds such as anthracene, salicylic acid salts, pyrene, and coronene, which are given in JP-A-4-132189.

A metal or alloy having a low work function is used as a cathode material. Examples thereof include aluminum, indium, magnesium, titanium, magnesium-silver alloys, and aluminum-lithium alloys. There are cases where a barrier film for excluding the influence of oxygen or moisture in the air is formed on the cathode by vapor deposition, sputtering, coating, etc. Examples of materials for the barrier film include inorganic oxides such as SiO, $SiO_2$, and $Al_2O_3$, thermo-setting resins, photocurable resins, and silane polymer materials having a barrier effect.

Examples of a substrate for use in an organic electroluminescent element include a transparent or translucent material for effectively taking out luminescence from a luminescent layer. Although, a glass substrate is generally used, a flexible resin substrate such as a polyethylene terephthalate film, etc. can be used.

The organic electroluminescent element of the present invention will be explained below in more detail by reference to Examples.

EXAMPLE 1

Each of Exemplified Compounds according to the present invention was vapor-deposited in a vacuum ($3\times10^{-6}$ Torr) from a heated board on an ITO substrate (manufactured by Asahi Glass Co., Ltd.; sheet resistance, 15 Ω) which had undergone ultrasonic cleaning in acetone for 5 minutes and drying with compressed dry air. Thus, each compound was deposited in a thickness of 100 nm on the substrate. The vapor-deposited Exemplified Compounds are shown in Table 1. With respect to each Exemplified Compound, the coated substrate was taken out and the vapor deposition film was visually examined. The film was rubbed with a swab or a glass rod to evaluate its adhesion. The film-forming properties were sensorially evaluated by examining the film with a microscope, etc. as to whether the film was even and dense. Furthermore, the vapor deposition films thus formed were allowed to stand in the air (20° C., 40% RH) for 30 days, and the surface of each vapor deposition film was examined to evaluate the stability of the film. The results of these evaluations are shown in Table 1.

A Comparative Example was conducted as follows. Vapor deposition films were formed in the same manner as the above, except that the compounds according to the present invention were replaced with each of the following compounds (A) to (E), which are within the scope of the compounds characteristic of JP-A-59-194393 (Kodak) or JP-A-5-343184 (Fuji Xerox). These vapor deposition films were subjected to the same evaluations. The results of the evaluations are shown in Table 2. Tables 1 and 2 show that the Exemplified Compounds according to the present invention were superior in the stability of vapor deposition films to the compounds of the Comparative Example.

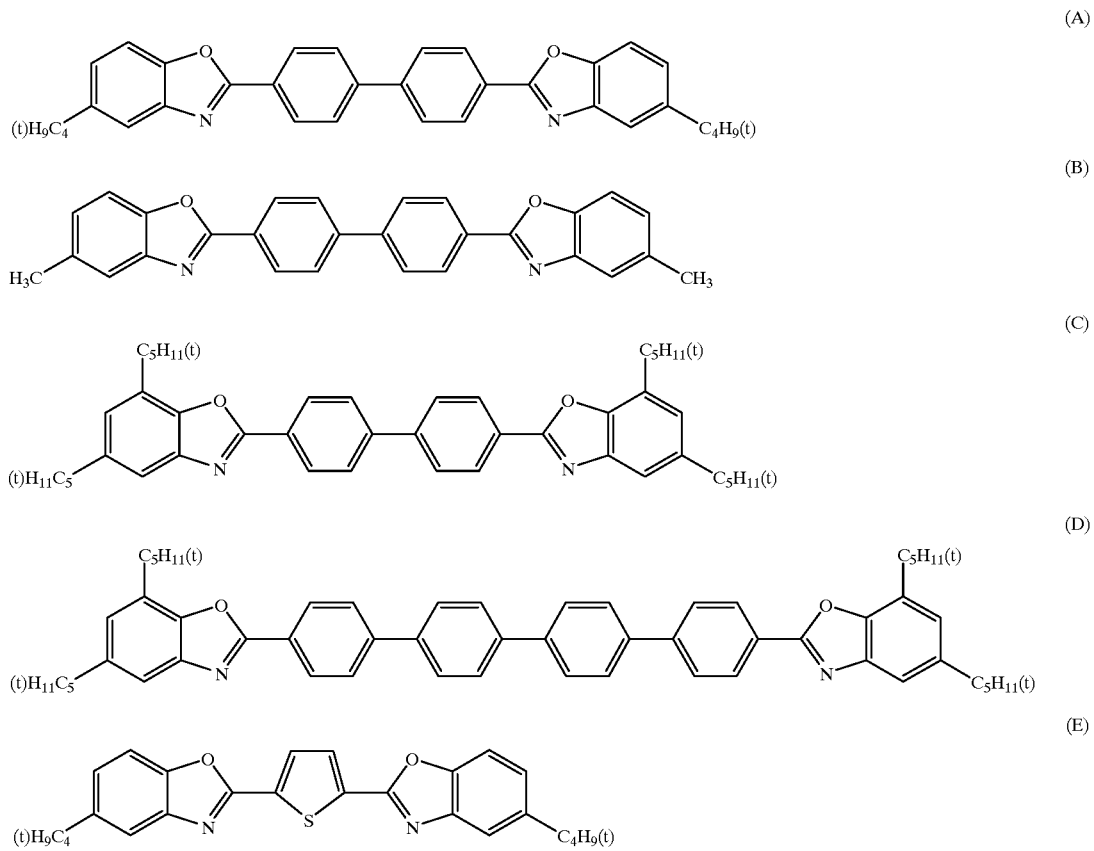

TABLE 1

| | Just after film formation | After 30-day standing in the air |
|---|---|---|
| Exemplified Compound (5) | slightly poor adhesion, even film, Δ | no change |
| Exemplified Compound (10) | good adhesion, even, dense film, ○ | no change |
| Exemplified Compound (13) | good adhesion, even, dense film, ○ | no change |
| Exemplified Compound (15) | slightly poor adhesion, even film, Δ | no change |
| Exemplified Compound (22) | slightly poor adhesion, even film, Δ | no change |
| Exemplified Compound (41) | good adhesion, even, dense film, ○ | no change |
| Exemplified Compound (43) | good adhesion, even, dense film, ○ | no change |
| Exemplified Compound (50) | good adhesion, even, dense film, ○ | no change |
| Exemplified Compound (57) | good adhesion, even, dense film, ○ | no change |
| Exemplified Compound (58) | good adhesion, even, dense film, ○ | no change |
| Exemplified Compound (59) | good adhesion, even, dense film, ○ | no change |
| Exemplified Compound (60) | good adhesion, even, dense film, ○ | no change |
| Exemplified Compound (62) | good adhesion, even, dense film, ○ | no change |
| Exemplified Compound (63) | good adhesion, even, dense film, ○ | no change |
| Exemplified Compound (79) | good adhesion, even, dense film, ○ | no change |
| Exemplified Compound (82) | good adhesion, even, dense film, ○ | no change |

TABLE 2

| | Just after film formation | After 30-day standing in the air |
|---|---|---|
| Compound (A) | no adhesion, uneven film, x | wholly crystallized |
| Compound (B) | no adhesion, uneven film, x | wholly crystallized |
| Compound (C) | slightly poor adhesion, even film, Δ | partly crystallized |
| Compound (D) | slightly poor adhesion, even film, Δ | partly crystallized |
| Compound (E) | slightly poor adhesion, even film, Δ | partly crystallized |

EXAMPLE 2

Exemplified Compounds according to the present invention were examined for fluorescent properties. For the determination of fluorescent spectrum in a dilute solution, each Exemplified Compound was dissolved in chloroform in a concentration of $2 \times 10^{-5}$ mol %/R, and this dilute solution was placed in a quartz cell to prepare a sample. For the determination of fluorescent spectrum of a vapor deposition film, each Exemplified Compound was vapor-deposited in a vacuum ($3 \times 10^{-6}$ Torr) from a heated board on a quartz substrate which had undergone ultrasonic cleaning in acetone for 5 minutes and drying with compressed dry air to thereby prepare a sample in which the substrate had a 100 nm-thick deposit of the compound. The samples thus prepared each was set on a fluorescence spectrometer (LS-50B, manufactured by Perkin Elmer Corp.) and examined for fluorescent properties. For the purpose of comparison in fluorescent intensity, fluorescence was examined under the same conditions. In the examination of the solutions, the diaphragms of the slits on the excitation side and the fluorescence side were set at 5, and a 15% extinction filter was disposed on the fluorescence side. In the examination of the vapor deposition films, the slits on the excitation and fluorescence sides were set at 5, and no extinction filter was disposed. The maximum of peak fluorescence intensity was 1,000. With respect to the materials having a peak fluorescence intensity exceeding that value, i.e., in the over-range, the spectral examination was made with the diaphragms being narrowed further. The results of the examination of the solutions and thin films for fluorescent properties are shown in Table 3.

As a Comparative Example, samples were produced using compounds (A) to (E) specified above, and their fluorescent properties were determined. The results obtained are shown in Table 4. The Exemplified Compounds according to the present invention each showed exceedingly intense fluorescence in both the solution state and the thin-film state as compared with the comparative compounds. This indicates that the compounds according to the present invention each is useful not only as a luminescent layer consisting only of the compound but also in a constitution in which the compound is present as a low-concentration dopant in other compound(s).

TABLE 3

| | Fluorescent Properties in Solution (luminescence peak value) | | | | Fluorescent Properties of Vapor Deposition Film (luminescence peak value) | | | |
|---|---|---|---|---|---|---|---|---|
| | Excitation wavelength (nm) | Luminescence wavelength (nm) | Half-band width (nm) | Fluorescence intensity | Excitation wavelength (nm) | Luminescence wavelength (nm) | Half-band width (nm) | Fluorescence intensity |
| Exemplified Compound (5) | 357 | 430 | 59 | 530 | 333 | 445 | 57 | 480 |
| Exemplified Compound (10) | 388 | 415 | 59 | 580 | 347 | 451 | 73 | 720 |
| Exemplified Compound (13) | 358 | 418 | 57 | 620 | 338 | 450 | 62 | 700 |
| Exemplified Compound (15) | 395 | 515 | 62 | ≧1000 | 398 | 507 | 60 | 780 |
| Exemplified Compound (22) | 441 | 492 | 61 | ≧1000 | 396 | 505 | 54 | 880 |

TABLE 3-continued

|  | Fluorescent Properties in Solution (luminescence peak value) | | | | Fluorescent Properties of Vapor Deposition Film (luminescence peak value) | | | |
| --- | --- | --- | --- | --- | --- | --- | --- | --- |
|  | Excitation wavelength (nm) | Luminescence wavelength (nm) | Half-band width (nm) | Fluorescence intensity | Excitation wavelength (nm) | Luminescence wavelength (nm) | Half-band width (nm) | Fluorescence intensity |
| Exemplified Compound (41) | 385 | 406 | 45 | ≧1000 | 396 | 453 | 38 | 940 |
| Exemplified Compound (43) | 434 | 471 | 55 | ≧1000 | 387 | 483 | 66 | 650 |
| Exemplified Compound (57) | 390 | 416 | 60 | 700 | 350 | 455 | 75 | 750 |
| Exemplified Compound (63) | 385 | 414 | 52 | 780 | 389 | 432 | 61 | 730 |

TABLE 4

|  | Fluorescent Properties in Solution (luminescence peak value) | | | | Fluorescent Properties of Vapor Deposition Film (luminescene peak value) | | | |
| --- | --- | --- | --- | --- | --- | --- | --- | --- |
|  | Excitation wavelength (nm) | Luminescence wavelength (nm) | Half-band width (nm) | Fluorescence intensity | Excitation wavelength (nm) | Luminescence wavelength (nm) | Half-band width (nm) | Fluorescence intensity |
| Compound (A) | 338 | 385 | 52 | 190 | 331 | 423 | 48 | 170 |
| Compound (B) | 338 | 405 | 50 | 250 | 396 | 432 | 54 | 180 |
| Compound (C) | 396 | 412 | 36 | 310 | 331 | 412 | 57 | 190 |
| Compound (D) | 337 | 397 | 42 | 380 | 330 | 430 | 55 | 250 |
| Compound (E) | 388 | 435 | 48 | 110 | 347 | 450 | 77 | 60 |

EXAMPLE 3

Using each of Exemplified Compounds according to the present invention, an organic electroluminescent element was produced in which the compound constituted a luminescent layer. TPD (manufactured by Tri Chemical Laboratory Inc.) was vapor-deposited from a tantalum board on sufficiently cleaned ITO (manufactured by Asahi Glass Co., Ltd.; sheet resistance, 15 Ω) in a thickness of 50 nm at a deposition rate of from 0.1 to 0.2 nm/sec. Each of the Exemplified Compounds shown in Table 5 was vapor-deposited thereon from a tantalum board in a thickness of 60 nm at a deposition rate of from 0.1 to 0.2 nm/sec. Furthermore, using an Al—Li alloy (manufactured by Kojundo Chemical Co., Ltd.), an Al—Li alloy go having a lithium concentration of 15 at % was vapor-deposited from a tungsten board in a thickness of 200 nm at a deposition rate of 0.5 nm/sec to complete an organic electroluminescent element. In order to compare the elements in luminance properties, the luminance of each element was determined with luminescent meter BM-8, manufactured by Topcon Co. Further, Source Measure Unit 236, manufactured by Keithley Instruments Inc., was used as a power source, with the positive and the negative electrodes being connected to the ITO and the cathode, respectively. Under these conditions, each element was examined for voltage, luminance, and current. The luminescent spectrum of each element was determined with LS-50B, manufactured by Perkin Elmer Corp. In order to examine each element for working life, the element was connected to a constant-current power source (Source Measure Unit 236, manufactured by Keithley Instruments Inc.) to conduct a continuous element driving test. For the driving test, the power source was regulated so as to have such a constant current that an element having a luminescence area of 8 $mm^2$ had an initial luminance of 100 $cd/m^2$. Each element was further evaluated for half-value period, which is the period required for the element to have a luminance which is a half of the initial luminance value. The results of the evaluations are shown in Table 5.

As a Comparative Example, each of compounds (A) to (E) specified above was used to produce an organic electroluminescent element in which the compound constituted a luminescent layer, in the same manner as the above. These elements were examined for luminance properties and luminescent spectrum and subjected to a continuous driving test for examining working life, in the same manners as the above. The results of these evaluations are shown in Table 6. The elements employing the Exemplified Compounds according to the present invention had far better luminance properties and working lives than the comparative elements.

TABLE 5

| | Element constitution | Luminescence initiation voltage (V) | Luminance at 10 mA/cm² (cd/m²) | Luminance at 100 mA/cm² (cd/m²) | Luminescence peak (nm) | Half-band width (nm) | Half-value period from initial 100 cd/m² |
|---|---|---|---|---|---|---|---|
| Exemplified Compound (10) | ITO/TPD/Compound (10)/Al-Li | 4.0 | 380 | 2300 | 452 | 84 | 20 hr |
| Exemplified Compound (13) | ITO/TPD/Compound (13)/Al-Li | 6.0 | 300 | 2000 | 455 | 55 | 15 hr |
| Exemplified Compound (41) | ITO/TPD/Compound (41)/Al-Li | 4.0 | 380 | 2300 | 452 | 84 | 20 hr |
| Exemplified Compound (43) | ITO/TPD/Compound (43)/Al-Li | 7.0 | 280 | 2200 | 487 | 70 | 20 hr |
| Exemplified Compound (57) | ITO/TPD/Compound (57)/Al-Li | 6.0 | 350 | 2000 | 460 | 62 | 10 hr |

TABLE 6

| | Element constitution | Luminescence initiation voltage (V) | Luminance at 10 mA/cm² (cd/m²) | Luminance at 100 mA/cm² (cd/m²) | Luminescence peak (nm) | Half-band width (nm) | Half-value period from initial 100 cd/m² |
|---|---|---|---|---|---|---|---|
| Compound (A) | ITO/TPD/Compound (A)/Al-Li | no luminescence | — | — | — | — | — |
| Compound (B) | ITO/TPD/Compound (B)/Al-Li | no luminescence | — | — | — | — | — |
| Compound (C) | ITO/TPD/Compound (C)/Al-Li | 6.0 | 120 | 850 | 495 | 62 | 50 min |
| Compound (D) | ITO/TPD/Compound (D)/Al-Li | 6.0 | 160 | 1000 | 448 | 90 | 1 hr |
| Compound (E) | ITO/TPD/Compound (E)/Al-Li | 10.0 | 80 | 600 | 523 | 75 | 10 min |

EXAMPLE 4

Each of Exemplified Compounds according to the present invention was used as a dopant in a luminescent layer to produce an organic electroluminescent element. Suitable host materials were selected for the individual dopants. In this selection, the excitation wavelength and ionization potential of each dopant were taken in account. Since this organic electroluminescent element according to the present invention has a constitution having an organic-compound layer containing at least one organic compound according to the present invention, organic compound(s) to be used in combination therewith can be selected from known compounds. TPD (manufactured by Tri Chemical Laboratory Inc.) was vapor-deposited from a tantalum board on sufficiently cleaned ITO (manufactured by Asahi Glass Co., Ltd.; sheet resistance, 15 2) in a thickness of 50 nm at a deposition rate of from 0.1 to 0.2 nm/sec. On the TPD were simultaneously vapor-deposited an Exemplified Compound (X) as a dopant material and a host material (Y) by the codeposition method. The dopant material (X), an Exemplified Compound, was deposited from a tantalum board at a deposition rate of from 0.01 to 0.05 nm/sec, while the host material (Y) was simultaneously deposited at a rate of from 0.5 to 2.5 nm/sec. This codeposition was conducted until the thickness of the host material film reached 20 nm. The ratio of the deposition rate of the dopant material (X), which was an Exemplified Compound, to that of the host material (Y) was regulated so as to result in a concentration of the dopant material (X) of 0.5 mol % in the host material (Y). The host material was further vapor-deposited on the codeposition layer in a thickness of 40 nm. Furthermore, using an Al—Li alloy (manufactured by Kojundo Chemical Co., Ltd.), an Al—Li alloy having a lithium concentration of 15 at % was vapor-deposited from a tungsten board on the host material layer in a thickness of 200 nm at a deposition rate of 0.5 nm/sec to complete an organic electroluminescent element. Table 7 shows the dopant (X)/host (Y) combinations used. The luminance of each element was determined with luminescent meter BM-8, manufactured by Topcon Co. Further, Source Measure Unit 236, manufactured by Keithley Instruments Inc., was used as a power source, with the positive and the negative electrodes being connected to the ITO and the cathode, respectively. Under these conditions, each element was examined for voltage, luminance, and current. The luminescent spectrum of each element was determined with LS-50B, manufactured by Perkin Elmer Corp. In order to examine each element for working life, the element was connected to a constant-current power source (Source Measure Unit 236, manufactured by Keithley Instruments Inc.)

to conduct a continuous element driving test. For the driving test, the power source was regulated so as to have such a constant current that an element having a luminescence area of 8 mm² had an initial luminance of 100 cd/m². Each element was further evaluated for half-value period, which is the period required for the element to have a luminance which is a half of the initial luminance value. The results of the evaluations are shown in Table 7.

As a Comparative Example, an element was produced in the same manner as the above, except that a luminescent layer was formed from compound (C) specified above as a host material and compound (E) specified above as a dopant material. This element was examined for luminance and luminescent spectrum and subjected to a continuous driving test for examining working life, in the same manners as the above. The results of these evaluations are shown in Table 8. The elements of the Example having the constitution according to the present invention had far better luminance properties and working lives than the comparative element.

EXAMPLE 5

The Exemplified Compounds according to the present invention mostly have excellent electron-transporting properties. In addition, the Exemplified Compounds are excellent in film-forming property and the stability of vapor deposition film as shown in Example 1. It is therefore preferred to use these compounds between a luminescent layer and a cathode. Accordingly, an organic electroluminescent element was produced which employed an Exemplified Compound according to the present invention as a buffer or electron-transporting layer between a luminescent layer and a cathode. TPD (manufactured by Tri Chemical Laboratory Inc.) was vapor-deposited from a tantalum board on sufficiently cleaned ITO -(manufactured by Asahi Glass Co., Ltd.; sheet resistance, 15 Ω) in a thickness of 50 nm at a deposition rate of from 0.1 to 0.2 nm/sec. Exemplified Compound (10) was vapor-deposited thereon from a tantalum board in a thickness of 40 nm at a deposition rate of from 0.1 to 0.2 nm/sec. Each of the Exemplified Compounds

TABLE 7

| Luminescent Layer Constituent Compounds | | | | Luminescence initiation voltage (V) | Luminance at 10 mA/cm² (cd/m²) | Luminance at 100 mA/cm² (cd/m²) | Luminescent Spectrum | | Half-value period from initial 100 cd/m² |
|---|---|---|---|---|---|---|---|---|---|
| Dopant material (X) | Host material (Y) | Element constitution | | | | | Luminescence peak (nm) | Half-band width (nm) | |
| Exemplified Compound (43) | Compound (C) | ITO/TPD/luminescent layer/Al-Li | | 8.0 | 240 | 1600 | 471 | 93 | 18 hr |
| Exemplified Compound (43) | Exemplified Compound (13) | ITO/TPD/luminescent layer/Al-Li | | 5.0 | 350 | 2700 | 476 | 72 | 50 hr |
| Exemplified Compound (43) | Compound (D) | ITO/TPD/luminescent layer/Al-Li | | 6.0 | 270 | 2200 | 476 | 86 | 20 hr |
| Exemplified Compound (22) | Compound (C) | ITO/TPD/luminescent layer/Al-Li | | 6.0 | 540 | 4200 | 497 | 70 | 85 hr |
| Exemplified Compound (22) | Exemplified Compound (13) | ITO/TPD/luminescent layer/Al-Li | | 5.0 | 1200 | 9400 | 478 | 74 | 200 hr |
| Exemplified Compound (22) | Exemplified Compound (10) | ITO/TPD/luminescent layer/Al-Li | | 3.5 | 1050 | 8600 | 486 | 59 | 180 hr |
| Exemplified Compound (15) | Compound (C) | ITO/TPD/luminescent layer/Al-Li | | 5.0 | 350 | 2500 | 494 | 78 | 30 hr |

TABLE 8

| Luminescent Layer Constituent Compounds | | | | Luminescence initiation voltage (V) | Luminance at 10 mA/cm² (cd/m²) | Luminance at 100 mA/cm² (cd/m²) | Luminescent Spectrum | | Half-value period from initial 100 cd/m² |
|---|---|---|---|---|---|---|---|---|---|
| Dopant material (X) | Host material (Y) | Element constitution | | | | | Luminescence peak (nm) | Half-band width (nm) | |
| Compound (E) | Compound (C) | ITO/TPD/luminescent layer/Al-Li | | 9.0 | 50 | 380 | 472 | 103 | 10 min | shown in Table 9 was vapor-deposited thereon from a tantalum board in a thickness of 25 nm at a deposition rate of from 0.1 to 0.2 nm/sec. Furthermore, using an Al—Li alloy (manufactured by Kojundo Chemical Co., Ltd.), an Al—Li alloy having a lithium concentration of 15 at % was vapor-deposited from a tungsten board in a thickness of 200 nm at a deposition rate of 0.5 nm/sec to complete an organic electroluminescent element. In order to compare the elements in luminance properties, the luminance of each element was determined with luminescent meter BM-8, manufactured by Topcon Co. Further, Source Measure Unit 236, manufactured by Keithley Instruments Inc., was used as a power source, with the positive and the negative electrodes being connected to the ITO and the cathode, respectively. Under these conditions, each element was examined for voltage, luminance, and current. The luminescent spectrum of each element was determined with LS-50B, manufactured by Perkin Elmer Corp. In order to examine each element for working life, the element was connected to a constant-current power source (Source Measure Unit 236, manufactured by Keithley Instruments Inc.) to conduct a continuous element driving test. For the driving test, the power source was regulated so as to have such a constant current that an element having a luminescence area of 8 mm$^2$ had an initial luminance of 100 cd/m$^2$. Each element was further evaluated for half-value period, which is the period required for the element to have a luminance which is a half of the initial luminance value. The results of the evaluations are shown in Table 9.

As a Comparative Example, each of-compounds (C), (D), and (E) specified above was used to produce an element in which the compound constituted a buffer or electron-transporting layer interposed between the luminescent layer and the cathode, in the same manner as the above. These elements were examined for luminance properties and luminescent spectrum and subjected to a continuous driving test for examining working life, in the same manners as the above. The results of these evaluations are shown in Table 10. The elements of the Example having the constitution according to the present invention had far better luminance properties and working lives than the comparative elements. In particular, the elements according to the present invention had greatly improved working lives. Although Exemplified Compound (10) was employed in a luminescent region in each of the elements of the present invention, similar results were obtained in the case where other Exemplified Compounds according to the present invention were used.

TABLE 9

| | | | Luminescence | | | Luminescent Spectrum | | Half-value |
|---|---|---|---|---|---|---|---|---|
| | Electron-transporting (buffer) layer | | cence initiation | Luminance at 10 | Luminance at 100 | Luminescence | Half-band | period from initial |
| | | Element constitution | voltage (V) | mA/cm$^2$ (cd/m$^2$) | mA/cm$^2$ (cd/m$^2$) | peak (nm) | width (nm) | 100 cd/m$^2$ |
| Exemplified Compound (50) | ITO/TPD/Exemplified Compound (10)/Exemplified Compound (50)/Al-Li | | 5.0 | 450 | 2000 | 520 | 90 | 60 hr |
| Exemplified Compound (60) | ITO/TPD/Exemplified Compound (10)/Exemplified Compound (60)/Al-Li | | 4.0 | 400 | 2300 | 450 | 85 | 70 hr |
| Exemplified Compound (63) | ITO/TPD/Exemplified Compound (10)/Exemplified Compound (63)/Al-Li | | 5.0 | 370 | 2300 | 462 | 84 | 93 hr |
| Exemplified Compound (82) | ITO/TPD/Exemplified Compound (10)/Exemplified Compound (82)/Al-Li | | 4.0 | 410 | 2600 | 456 | 78 | 156 hr |

TABLE 10

| Electron-transporting (buffer) layer | | Luminescence initiation voltage (V) | Luminance at 10 mA/cm² (cd/m²) | Luminance at 100 mA/cm² (cd/m²) | Luminescent Spectrum | | Half-value period from initial 100 cd/m² |
|---|---|---|---|---|---|---|---|
| | Element constitution | | | | Luminescence peak (nm) | Half-band width (nm) | |
| Compound (C) | ITO/TPD/Compound (D)/Compound (C)/Al-Li | 10.0 | 150 | 900 | 452 | 83 | 50 min |
| Compound (D) | ITO/TPD/Compound (C)/Compound (D)/Al-Li | 10.0 | 100 | 700 | 490 | 70 | 50 min |
| Compound (D) | ITO/TPD/Compound (E)/Compound (D)/Al-Li | 12.0 | 70 | 500 | 515 | 81 | 15 min |
| Compound (E) | ITO/TPD/Compound (D)/Compound (E)/Al-Li | 9.0 | 100 | 600 | 464 | 84 | 30 min |

As described above, it has become possible to provide a stable organic electroluminescent element having a high luminescent efficiency by using an organic compound according to the present invention. In particular, an organic electroluminescent element having a high efficiency and excellent stability can be provided by using an organic compound according to the present invention in an organic-compound layer, especially a luminescent layer, between the anode and the cathode, or by using the organic compound in an electron-transporting layer between a luminescent layer and the cathode. As a result, the possibility of the practical use of organic electroluminescent elements in displays and other apparatuses has become exceedingly high.

While the invention has been described in detail and with reference to specific embodiments thereof, it will be apparent to one skilled in the art that various changes and modifications can be made therein without departing from the spirit and scope thereof.

What is claimed is:

1. An organic electroluminescent element comprising a substrate and, formed thereover, an anode for injecting holes, a cathode for injecting electrons, and at least one organic-compound layer interposed between the anode and the cathode, said organic-compound layer comprising at least one of organic compounds represented by the following formula (I), (II), or (III):

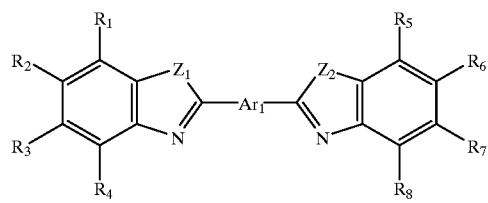

(I)

wherein $R_1$ to $R_8$ each represents a hydrogen atom or an optionally substitutable atom or group, provided that at least one of $R_1$ to $R_8$ represents an alkoxy group, an aryloxy group, a dialkylamino group, an N-alkyl-N-arylamino group, or a diarylamino group; $Ar_1$ represents a bivalent group derived from benzene, anthracene, or an aromatic heterocyclic ring or from an aromatic hydrocarbon ring assembly, provided that the bivalent group derived from benzene or anthracene is an m- or o-phenylene group or a 1,5-, 2,6-, or 1,8-anthracenediyl group, respectively; and $Z_1$ and $Z_2$ each represents an oxygen atom, a sulfur atom, or a monosubstituted nitrogen atom;

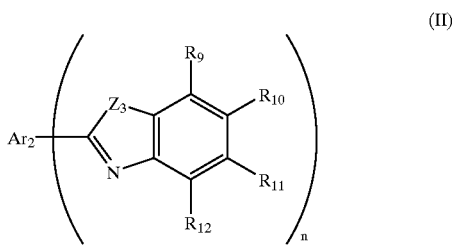

(II)

wherein $R_9$ to $R_{12}$ each represents a hydrogen atom or an optionally substitutable atom or group, provided that at least one of $R_9$ to $R_{12}$ represents an alkoxy group, an aryloxy group, a dialkylamino group, an N-alkyl-N-arylamino group, or a diarylamino group; $Ar_2$ represents a group derived from benzene, naphthalene, anthracene, or an aromatic heterocyclic ring or from an aromatic ring assembly, provided that $Ar_2$ does not represent a group derived from triazine; $Z_3$ represents an oxygen atom, a sulfur atom, or a mono substituted nitrogen atom; and n represents an integer of 3 or 4;

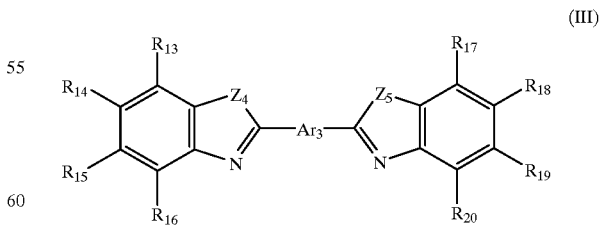

(III)

wherein $R_{13}$ to $R_{20}$ each represents a hydrogen atom or an optionally substitutable atom or group, provided that at least one of $R_{13}$ to $R_{20}$ represents an alkoxy group, an aryloxy group, a dialkylamino group, an N-alkyl-N-arylamino group or a diarylamino group; $Ar_3$ represents a bivalent group derived from an aromatic ring assembly containing at least one aromatic heterocyclic ring; and $Z_4$ and $Z_5$ each represents an oxygen atom, a sulfur atom, or a monosubstituted nitrogen atom.

2. The organic electroluminescent element as claimed in claim 1, wherein the organic-compound layer has a luminescent layer having a luminescent region and the luminescent layer comprises at least one of the organic compounds represented by formula (I), (II), or (III).

3. The organic electroluminescent element as claimed in claim 2, wherein the luminescent layer comprises at least two organic compounds, at least one of which is represented by formula (I), (II), or (III).

4. The organic electroluminescent element as claimed in claim 2, wherein the organic-compound layer has a laminated structure comprising the luminescent layer and a layer of another kind of organic material having electron-transporting or hole-transporting properties, or is made of a luminescent layer containing another kind of organic material having electron-transporting or hole-transporting properties in addition to containing at least one organic compound of formula (I), (II), or (III).

5. The organic electroluminescent element as claimed in claim 1, wherein the organic-compound layer has a laminated structure comprising a luminescent layer containing at least one organic compound of formula (I), (II), or (III) and a layer of another kind of organic material having electron-transporting or hole-transporting properties, or is made of a luminescent layer containing another kind of organic material having electron-transporting or hole-transporting properties in addition to containing at least one organic compound of formula (I), (II), or (III).

6. The organic electroluminescent element as claimed in claim 1, wherein the organic-compound layer is made of a dispersion comprising a polymeric compound and the at least one organic compound dispersed therein.

7. The organic electroluminescent element as claimed in claim 1, wherein the compound of formula (I) is represented by formula (IV) or (V):

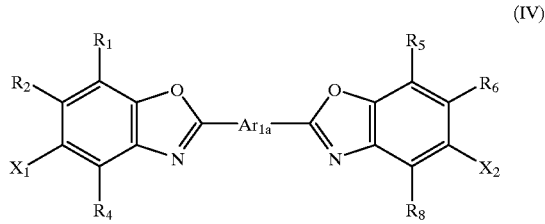

(IV)

wherein $R_1$, $R_2$, $R_4$, $R_5$, $R_6$ and $R_8$ are the same as defined in claim 1; $X_1$ and $X_2$ each represents an alkoxy, aryloxy, dialkylamino N-alkyl-N-arylamino, or diarylamino group; and $Ar_{1a}$ is a bivalent group derived from thiophene or from a benzene ring assembly;

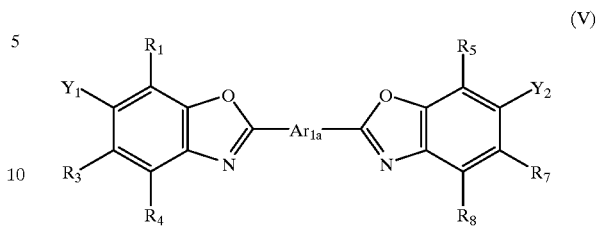

(V)

wherein $R_1$, $R_3$, $R_4$, $R_5$, $R_7$, and $R_8$ are the same as defined in claim 1; $Y_1$ and $Y_2$ each represents an alkoxy, aryloxy, dialkylamino, N-alkyl-N-arylamino, or diarylamino group; and $Ar_{1a}$ is the same as defined above.

8. The organic electroluminescent element as claimed in claim 7, wherein in formula (IV) or (V), $Ar_{1a}$ is a bivalent group derived from a benzene ring assembly.

9. The organic electroluminescent element as claimed in claim 1, wherein $Ar_3$ contains at least one aromatic heterocyclic ring selected from the group consisting of thiophene, furan, oxazole, oxadiazole, triazole, pyridine, pyrazine, pyrimidine, triazine, and carbazole, and at least one aromatic ring which is not heterocyclic.

10. An organic electroluminescent element comprising a substrate and, formed thereover, an anode for injecting holes, a cathode for injecting electrons, and at least one organic-compound layer interposed between the anode and the cathode, said organic-compound layer comprising at least one of organic compounds represented by the following formula (III'):

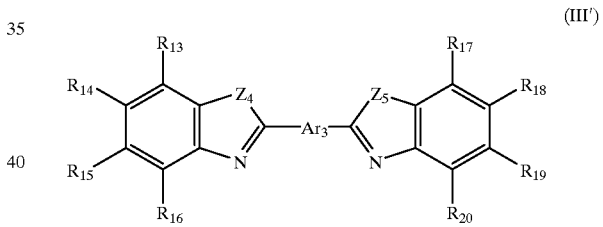

(III')

wherein $R_{13}$ to $R_{20}$ each represents a hydrogen atom or an optionally substitutable atom or group; $Ar_3$ represents a bivalent group derived from an unsubstituted aromatic ring assembly; and $Z_4$ and $Z_5$ each represents an oxygen atom, a sulfur atom, or a monosubstituted nitrogen atom, wherein the unsubstituted aromatic ring assembly is selected from the group consisting of

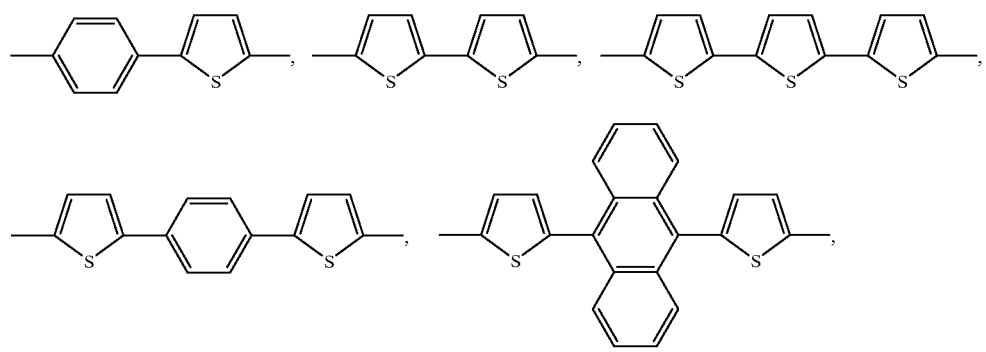

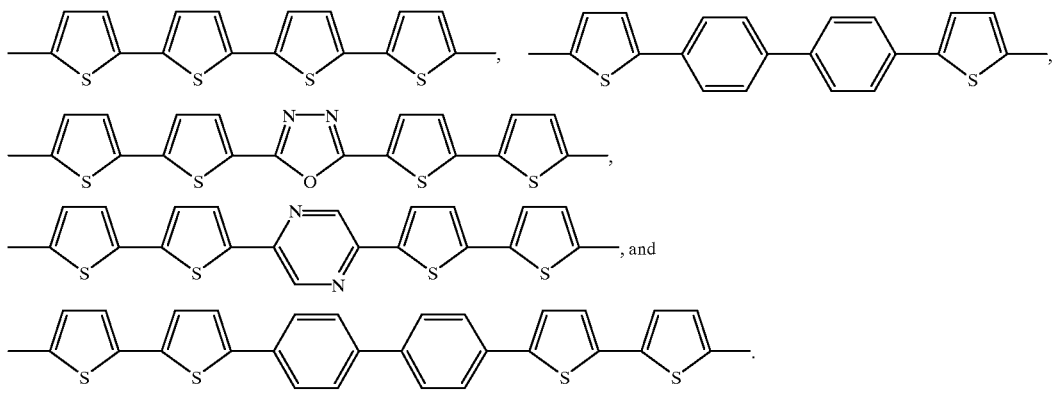

11. The organic electroluminescent element as claimed in claim 10, wherein the organic compounds represented by formula (III') are represented by the following formula (IV):

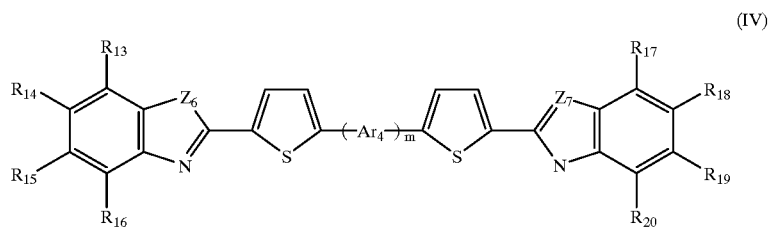

wherein $R_{13}$ to $R_{20}$ are the same as defined in general formula (III'); $Ar_4$ represents a 2,5-thiophenediyl or p-phenylene group; $Z_6$ and $Z_7$ each represents an atom having the same meaning as $Z_4$ and $Z_5$ and m represents an integer of 0 to 5.

* * * * *